US011035875B2

(12) United States Patent
Tanaka

(10) Patent No.: US 11,035,875 B2
(45) Date of Patent: Jun. 15, 2021

(54) PHYSICAL QUANTITY SENSOR, PHYSICAL QUANTITY SENSOR DEVICE, PORTABLE ELECTRONIC DEVICE, ELECTRONIC DEVICE, AND MOBILE BODY

(71) Applicant: Seiko Epson Corporation, Tokyo (JP)

(72) Inventor: Satoru Tanaka, Chino (JP)

(73) Assignee: Seiko Epson Corporation

( * ) Notice: Subject to any disclaimer, the term of this patent is extended or adjusted under 35 U.S.C. 154(b) by 127 days.

(21) Appl. No.: 16/117,188

(22) Filed: Aug. 30, 2018

(65) Prior Publication Data

US 2019/0064206 A1 Feb. 28, 2019

(30) Foreign Application Priority Data

Aug. 31, 2017 (JP) .............................. JP2017-167621

(51) Int. Cl.
*G01P 15/125* (2006.01)
*B81B 7/00* (2006.01)
*G01P 15/08* (2006.01)

(52) U.S. Cl.
CPC ............ *G01P 15/125* (2013.01); *B81B 7/007* (2013.01); *B81B 2201/0235* (2013.01); *B81B 2207/097* (2013.01); *B81C 2203/0109* (2013.01); *B81C 2203/0145* (2013.01); *B81C 2203/031* (2013.01); *G01P 2015/0814* (2013.01); *G01P 2015/0871* (2013.01)

(58) Field of Classification Search
CPC ........... G01P 15/125; G01P 2015/0871; G01P 2015/0814; G01P 2015/0808; G01P 205/0811; G01P 2015/0822; G01P 2015/084; B81B 7/007; B81B 2201/0235; B81B 2207/097; B81C 2203/0109; B81C 2203/0145; B81C 2203/031
USPC ........................... 73/514.32, 514.36, 514.38
See application file for complete search history.

(56) References Cited

U.S. PATENT DOCUMENTS 5,983,721 A 11/1999 Sulzberger et al.
7,322,242 B2 1/2008 Merassi et al.
(Continued)

FOREIGN PATENT DOCUMENTS

JP 2007-139505 A 6/2007
JP 2010-238921 A 10/2010
(Continued)

*Primary Examiner* — Robert R Raevis
(74) *Attorney, Agent, or Firm* — Harness, Dickey & Pierce, P.L.C.

(57) ABSTRACT

A physical quantity sensor includes a substrate, a movable section displaceable in a first direction with respect to the substrate, first and second movable electrode sections provided in the movable section, a first fixed electrode section fixed to the substrate and disposed to be opposed to the first movable electrode section in the first direction, a second fixed electrode section fixed to the substrate and disposed to be opposed to the second movable electrode section in the first direction, a restricting section configured to restrict a movable range in the first direction of the movable section, a first wire provided on the substrate and electrically connected to the first fixed electrode section, and a second wire provided on the substrate and electrically connected to the second fixed electrode section. The first wire and the second wire are respectively cross the restricting section in a plan view of the substrate.

12 Claims, 18 Drawing Sheets

(56) References Cited

U.S. PATENT DOCUMENTS

| | | |
|---|---|---|
| 8,516,890 B2 | 8/2013 | Rehle |
| 9,316,666 B2* | 4/2016 | Suzuki .................. G01P 15/125 |
| 2006/0032310 A1* | 2/2006 | Merassi ................ B81B 7/0048 |
| | | 73/514.35 |
| 2011/0048131 A1* | 3/2011 | Reinmuth ............. B81B 3/0051 |
| | | 73/504.12 |
| 2012/0303223 A1* | 11/2012 | Kasaba .................... B60Q 1/10 |
| | | 701/49 |
| 2015/0059474 A1 | 3/2015 | Tanaka |
| 2016/0061858 A1 | 3/2016 | Tanaka |
| 2019/0154728 A1 | 5/2019 | Tanaka |

FOREIGN PATENT DOCUMENTS

| | | |
|---|---|---|
| JP | 2013-024765 A | 2/2013 |
| JP | 2015-045600 A | 3/2015 |
| JP | 2016-048177 A | 4/2016 |

\* cited by examiner

PHYSICAL QUANTITY SENSOR, PHYSICAL QUANTITY SENSOR DEVICE, PORTABLE ELECTRONIC DEVICE, ELECTRONIC DEVICE, AND MOBILE BODY

BACKGROUND

1. Technical Field

The present invention relates to a physical quantity sensor, a physical quantity sensor device, a portable electronic device, an electronic device, and a mobile body.

2. Related Art

For example, an acceleration sensor described in JP-A-2007-139505 (Patent Literature 1) is configured by an SOI substrate including a first silicon substrate, a second silicon substrate, and an oxide silicon layer located between the first silicon substrate and the second silicon substrate. From the second silicon substrate, a fixed section, a movable section displaceable in an X-axis direction with respect to the fixed section, a plurality of movable electrode fingers connected to the movable section and extending in a Y-axis direction, and a fixed electrode finger fixed to the second silicon substrate, extending in the Y-axis direction, and forming capacitance between the fixed electrode finger and the movable electrode finger corresponding to the fixed electrode finger are formed. In such an acceleration sensor, the movable section is displaced by acceleration applied thereto, whereby the capacitance changes. The acceleration sensor can detect the applied acceleration on the basis of the change in the capacitance.

As explained above, the acceleration sensor described in Patent Literature 1 is configured by the SOI substrate. Therefore, for example, wires need to be formed from the second silicon substrate. In this case, a plurality of wires having different signals and polarities cannot be crossed. Flexibility of a wiring layout is low. Further, because the plurality of wires cannot be crossed, the wires need to be unnecessarily drawn around. Accordingly, a region where the wires are disposed increases in size. Therefore, a region allocated to an element section is likely to decrease in size. It is difficult to improve sensitivity of the sensor.

In the acceleration sensor described in Patent Literature 1, a stopper (a restricting section) that restricts the displacement of the movable section in the X-axis direction is not provided. Therefore, when the acceleration sensor receives an excessive shock of a drop or the like, it is also likely that the movable section is greatly displaced in the X-axis direction and the movable electrode finger and the fixed electrode finger are broken because of collision.

SUMMARY

An advantage of some aspects of the invention is to provide a physical quantity sensor, a physical quantity sensor device, a portable electronic device, an electronic device, and a mobile body that can improve detection accuracy and improve shock resistance.

The invention can be implemented as the following configurations.

A physical quantity sensor according to an aspect of the invention includes: a substrate; a movable section displaceable in a first direction with respect to the substrate; a first movable electrode section and a second movable electrode section provided in the movable section; a first fixed electrode section fixed to the substrate and disposed to be opposed to the first movable electrode section in the first direction; a second fixed electrode section fixed to the substrate and disposed to be opposed to the second movable electrode section in the first direction; a restricting section configured to restrict a movable range in the first direction of the movable section; a first wire provided on the substrate and electrically connected to the first fixed electrode section; and a second wire provided on the substrate and electrically connected to the second fixed electrode section. The first wire and the second wire are respectively caused to cross the restricting section in a plan view of the substrate.

With this configuration, the physical quantity sensor that can achieve improvement of detection accuracy and improvement of shock resistance is obtained.

In the physical quantity sensor according to the aspect of the invention, it is preferable that the movable section and the restricting section are electrically connected.

With this configuration, capacitance can be prevented from being formed between the movable section and the restricting section.

In the physical quantity sensor according to the aspect of the invention, it is preferable that the physical quantity sensor further includes an electrode section disposed on the substrate to overlap the movable section in the plan view and electrically connected to the movable section.

With this configuration, unintended displacement (displacement due to a force other than a physical quantity set as a detection target) of the movable section can be prevented.

In the physical quantity sensor according to the aspect of the invention, it is preferable that a gap between the restricting section and the movable section is partially narrowed.

With this configuration, excessive displacement of the movable section can be effectively prevented.

A physical quantity sensor according to another aspect of the invention includes: a substrate; a swinging body including a movable section including a first mass section and a second mass section, a fixed section supported by the substrate, and a coupling section coupling the movable section and the fixed section; a first fixed electrode section disposed on the substrate to be opposed to the first mass section; a second fixed electrode section disposed on the substrate to be opposed to the second mass section; a restricting section located along an outer edge of the swinging body in a plan view of the substrate and configured to restrict a movable range in the swinging body; a first wire provided on the substrate and electrically connected to the first fixed electrode section; and a second wire provided on the substrate and electrically connected to the second fixed electrode section. The first wire and the second wire are respectively caused to cross the restricting section in the plan view.

With this configuration, the physical quantity sensor that can achieve improvement of detection accuracy and improvement of shock resistance is obtained.

A physical quantity sensor device according to still another aspect of the invention includes: the physical quantity sensor according to the aspect of the invention; and a circuit element.

With this configuration, the effects of the physical quantity sensor according to the aspect of the invention can be enjoyed. The physical quantity sensor device having high reliability can be obtained.

A portable electronic device according to still another aspect of the invention includes: the physical quantity sensor according to the aspect of the invention; a case in which the physical quantity sensor is housed; a processing section housed in the case and configured to process output data from the physical quantity sensor; a display section housed in the case; and alight-transmissive cover closing an opening section of the case.

With this configuration, the effects of the physical quantity sensor according to the aspect of the invention can be enjoyed. The portable electronic device having high reliability can be obtained.

An electronic device according to still another aspect of the invention includes: the physical quantity sensor according to the aspect of the invention; a control circuit; and a correction circuit.

With this configuration, the effects of the physical quantity sensor according to the aspect of the invention can be enjoyed. The electronic device having high reliability can be obtained.

A mobile body according to still another aspect of the invention includes: the physical quantity sensor according to the aspect of the invention; and a posture control section.

With this configuration, the effects of the physical quantity sensor according to the aspect of the invention can be enjoyed. The mobile body having high reliability can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention are explained in detail below with reference to the accompanying drawings.

First Embodiment

First, a physical quantity sensor according to a first embodiment of the invention is explained.

Figure 1:
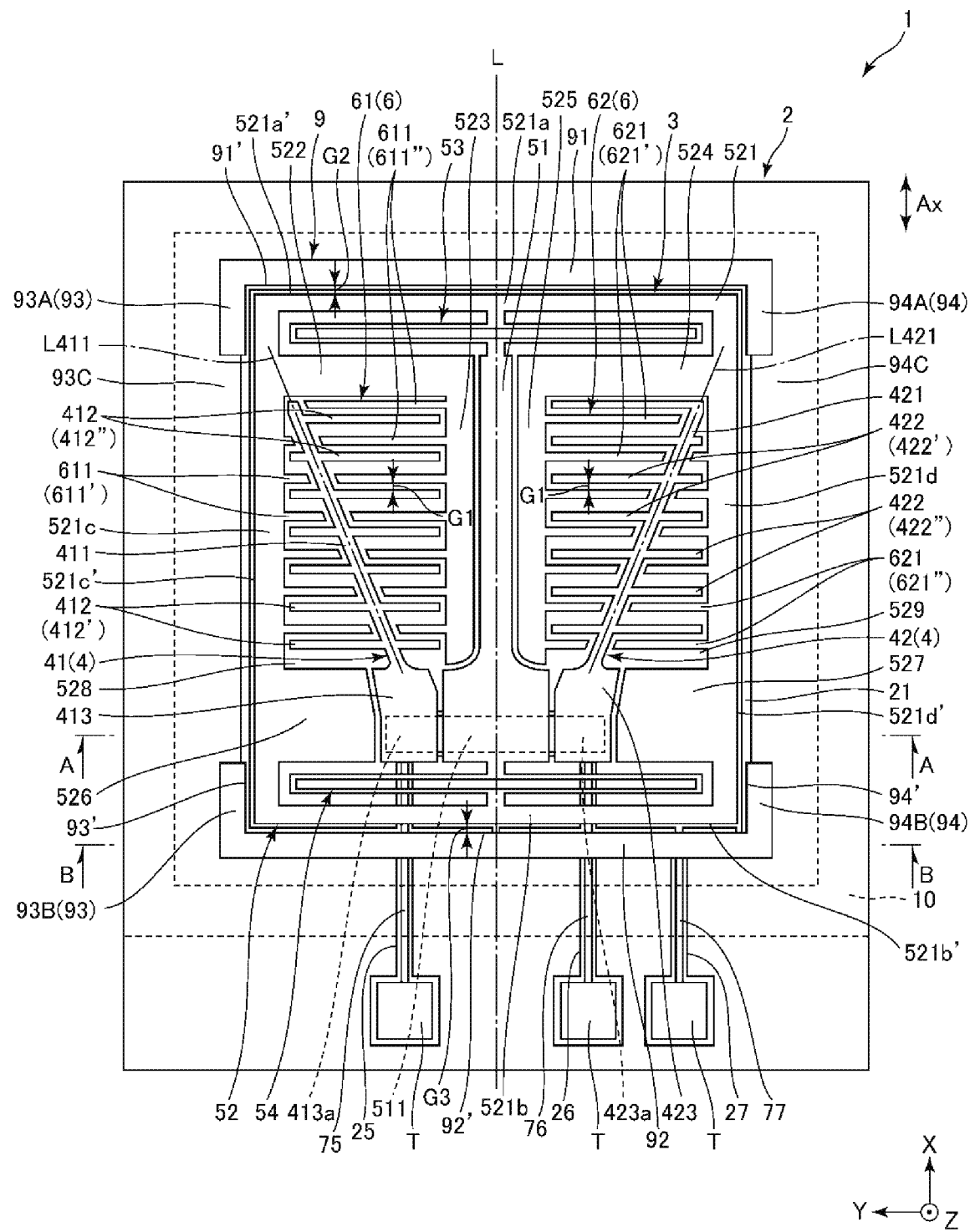
FIG. 1 is a plan view showing a physical quantity sensor according to a first embodiment of the invention.
Figure 2:
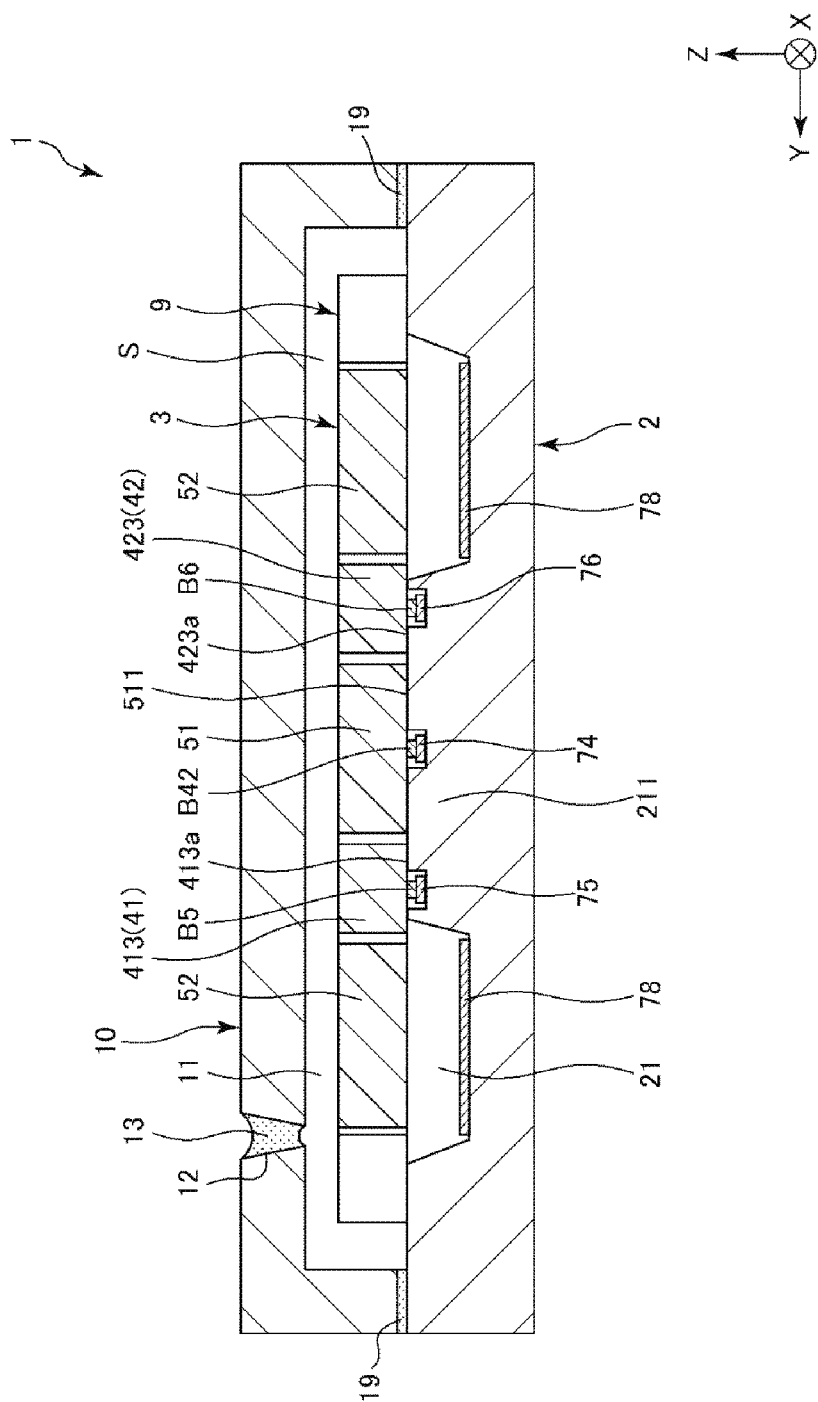
FIG. 2 is an A-A line sectional view in FIG. 1.
Figure 3:
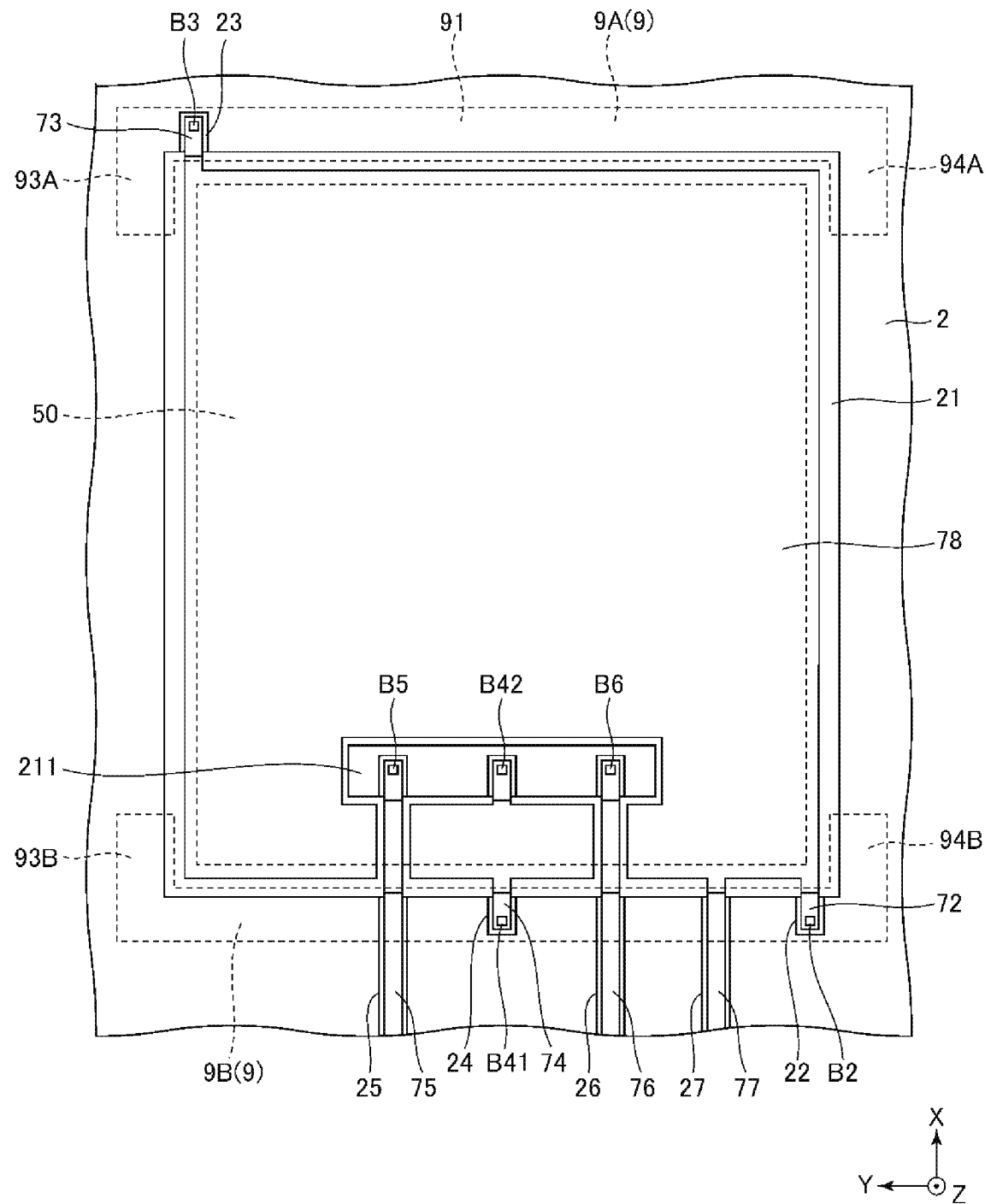
FIG. 3 is a plan view showing a substrate included in the physical quantity sensor shown in FIG. 1.
Figure 4:
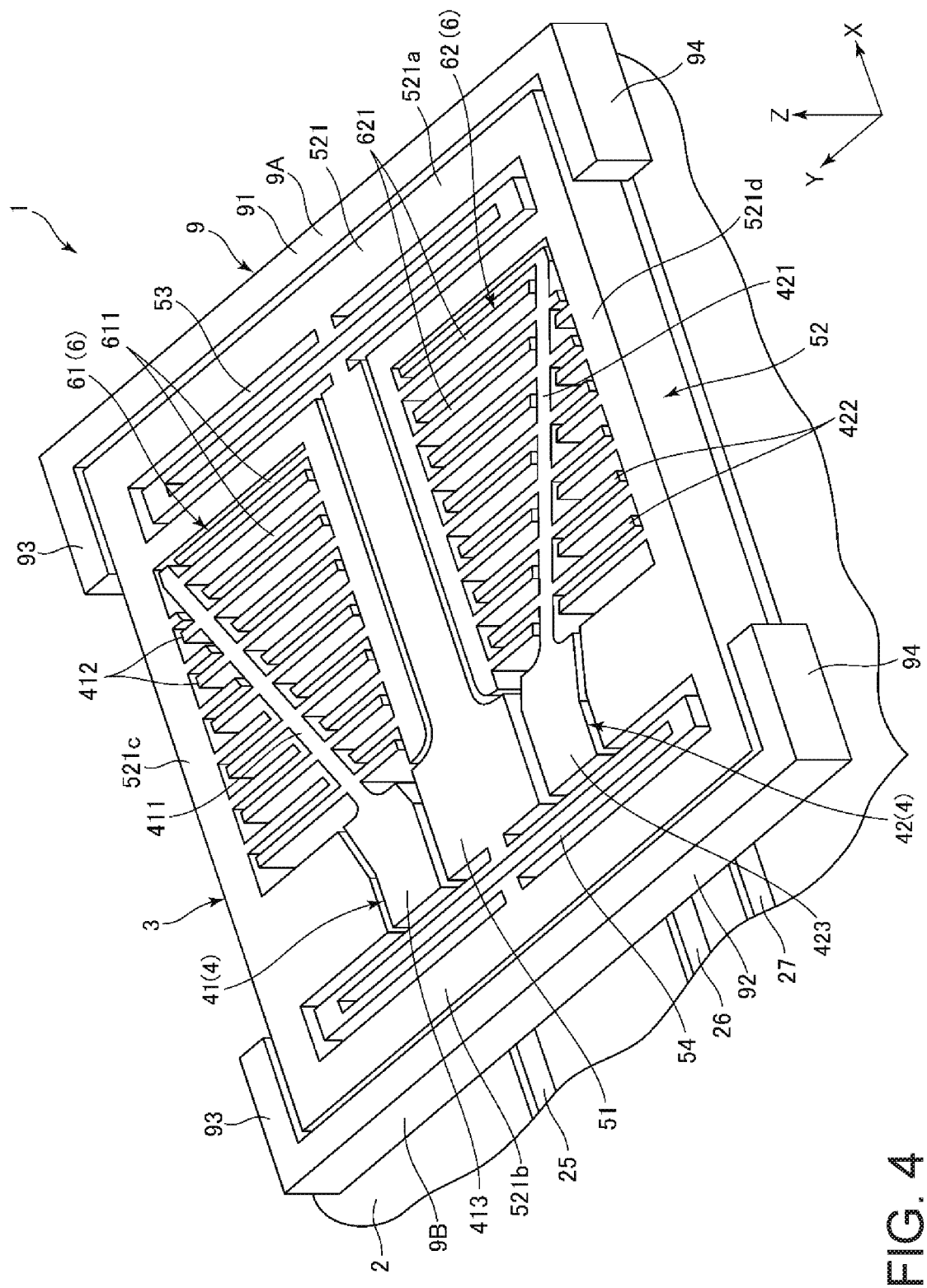
FIG. 4 is a perspective view of the physical quantity sensor shown in FIG. 1.
Figure 5:
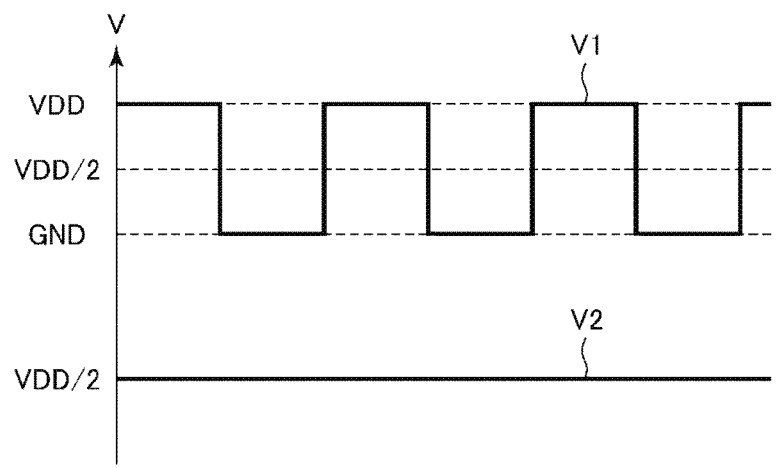
FIG. 5 is a diagram showing a voltage applied to the physical quantity sensor shown in FIG. 1.
Figure 6:
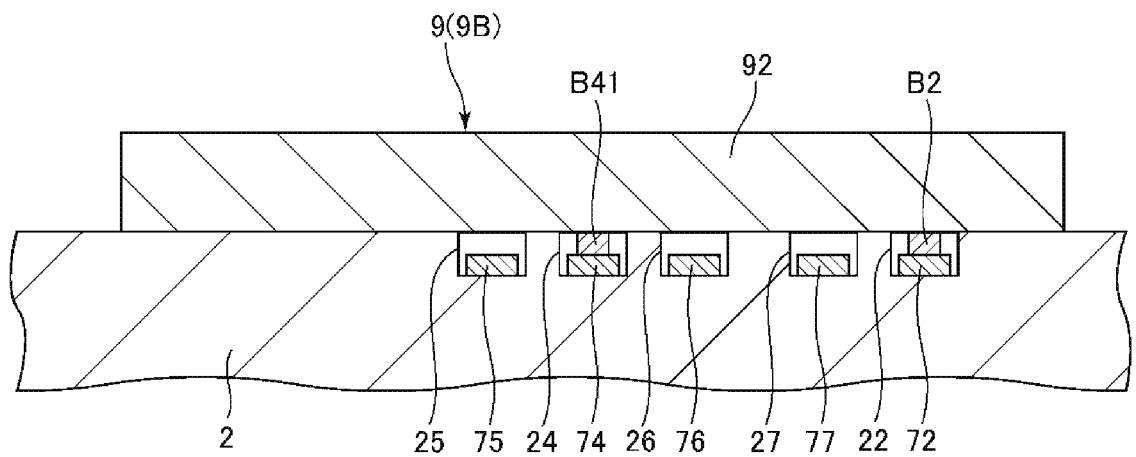
FIG. 6 is a B-B line sectional view in FIG. 1.
Figure 6:
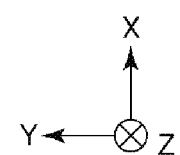

FIG. 1 is a plan view showing the physical quantity sensor according to the first embodiment of the invention. FIG. 2 is an A-A line sectional view in FIG. 1. FIG. 3 is a plan view showing a substrate included in the physical quantity sensor shown in FIG. 1. FIG. 4 is a perspective view of the physical quantity sensor shown in FIG. 1. FIG. 5 is a diagram showing a voltage applied to the physical quantity sensor shown in FIG. 1. FIG. 6 is a B-B line sectional view in FIG. 1. Note that, in the following explanation, for convenience of explanation, a paper surface near side in FIG. 1 and an upper side in FIG. 2 are referred to as "upper" as well and a paper surface depth side in FIG. 1 and a lower side in FIG. 2 are referred to as "lower" as well. As shown in the figures, three axes orthogonal to one another are represented as an X axis, a Y axis, and a Z axis. A direction parallel to the X axis is referred to as "X-axis direction" as well. A direction parallel to the Y axis is referred to as "Y-axis direction" as well. A direction parallel to the Z axis is referred to as "Z-axis direction" as well. An arrow direction distal end side of the axes is referred to as "plus side" as well. The opposite side is referred to as "minus side" as well.

A physical quantity sensor 1 shown in FIG. 1 is an acceleration sensor that can detect acceleration Ax in the X-axis direction. The physical quantity sensor 1 includes a substrate 2, an element section 3 provided on the substrate 2 and configured to detect the acceleration Ax (a physical quantity) in the X-axis direction, a restricting section 9 configured to restrict excessive displacement of the element section 3, and a lid body 10 bonded to the substrate 2 to cover the element section 3 and the restricting section 9.

Substrate

As shown in FIG. 1, the substrate 2 is formed in a tabular shape having a rectangular plan view shape. The substrate 2 includes a recessed section 21 opened to the upper surface. In a plan view from the Z-axis direction, the recessed section 21 is formed larger than the element section 3 to include the element section 3 on the inner side. The recessed section 21 functions as an escaping section for preventing contact of the element section 3 and the substrate 2. Note that a plan view shape of the substrate 2 is not particularly limited and may be any shape such as a triangle, a square other than a rectangle, a polygon such as a pentagon, a circle, an ellipse, or an irregular shape.

As shown in FIG. 2, the substrate 2 includes a protrusion-like mount section 211 provided on the bottom surface of the recessed section 21. A first fixed electrode section 41, a second fixed electrode section 42, and a fixed section 51 are respectively bonded to the mount section 211.

As shown in FIG. 3, the substrate 2 includes groove sections 22, 23, 24, 25, 26, and 27 opened to the upper surface. One end portions of the groove sections 25, 26, and 27 are respectively located on the outer side of the lid body 10. The other end portions are respectively connected to the recessed section 21. One end portions of the remaining groove sections 22, 23, and 24 are respectively located in the lid body 10. The other end portions are respectively connected to the recessed section 21.

As the substrate 2, for example, a glass substrate made of a glass material including an alkali metal ion (a movable ion) (borosilicate glass such as Pyrex glass (registered trademark) or Tempax glass (registered trademark)) can be used. Consequently, as explained blow, the element section 3 and the substrate 2 can be bonded by anodic bonding and can be firmly bonded. Because the substrate 2 having light transmissivity is obtained, a state of the element section 3 can be visually recognized from the outer side of the physical quantity sensor 1 via the substrate 2.

However, the substrate 2 is not limited to the glass substrate. For example, a silicon substrate or a ceramic substrate may be used as the substrate 2. Note that, when the silicon substrate is used, from the viewpoint of preventing a short circuit, it is desirable to use a high-resistance silicon substrate or use a silicon substrate, on the surface of which a silicon oxide film (an insulating oxide) is formed by thermal oxidation or the like.

As shown in FIGS. 1 and 3, wires 72, 73, 74, 75, 76, and 77 are provided in the groove sections 22, 23, 24, 25, 26 and 27. Among these wires, one end portions of the wires 75, 76, and 77 are respectively exposed to the outer side of the lid body 10 and function as terminals T for electric connection to an external device. The other end portion of the wire 75 is drawn around to the mount section 211 via the recessed section 21 and connected to the first fixed electrode section 41 via a conductive bump B5 on the mount section 211. The other end portion of the wire 76 is drawn around to the mount section 211 via the recessed section 21 and connected to the second fixed electrode section 42 via a conductive bump B6 on the mount section 211. The other end portion of the wire 77 is electrically connected to a dummy electrode 78 disposed on the bottom surface of the recessed section 21. Note that a function of the dummy electrode 78 is explained below.

The wire 72 is drawn out from the dummy electrode 78 to the groove section 22 and electrically connected to the restricting section 9 (a second portion 9B) via a conductive bump B2 in the groove section 22. The wire 73 is drawn out from the dummy electrode 78 to the groove section 23 and electrically connected to the restricting section 9 (a first portion 9A) via a conductive bump B3 in the groove section 23. The wire 74 is drawn around from the groove section 24 to the mount section 211 via the recessed section 21, electrically connected to the restricting section 9 (the second portion 9B) via a conductive bump B41 in the groove section 24, and electrically connected to the fixed section 51 via a conductive bump B42 on the mount section 211.

Note that a constituent material of the wires 72, 73, 74, 75, 76, and 77 and the dummy electrode 78 is not particularly limited. Examples of the constituent material include metal materials such as gold (Au), silver (Ag), platinum (Pt), palladium (Pd), iridium (Ir), copper (Cu), aluminum (Al), nickel (Ni), titanium (Ti), and tungsten (W), alloys containing the metal materials, and oxide-based transparent conductive materials such as ITO (Indium Tin Oxide), IZO (Indium Zinc Oxid), ZnO, and IGZO. One kind of these constituent materials can be used or two or more kinds of these constituent materials can be used in combination (e.g., as a stacked body of two or more layers).

Lid Body

As shown in FIG. 1, the lid body 10 is formed in a tabular shape having a rectangular plan view shape. As shown in FIG. 2, the lid body 10 includes a recessed section 11 opened to the lower surface. The lid body 10 is bonded to the substrate 2 to house the element section 3 in the recessed section 11. A housing space S for housing the element section 3 and the restricting section 9 is formed by the lid body 10 and the substrate 2. Note that the plan view shape of the lid body 10 is not particularly limited and is determined according to the plan view shape of the substrate 2. The plan view shape may be any shape such as a triangle, a square other than a rectangle, a polygon such as a pentagon, a circle, an ellipse, or an irregular shape.

As shown in FIG. 2, the lid body 10 includes a communication hole 12 for causing the inside and the outside of the housing space S to communicate. The housing space S can be replaced with a desired atmosphere via the communication hole 12. A sealing member 13 is disposed in the communication hole 12. The communication hole 12 is sealed by the sealing member 13.

The sealing member 13 is not particularly limited if the sealing member 13 can seal the communication hole 12. For example, various alloys such as a gold (Au)/tin (Sn)-based alloy, a gold (Au)/germanium (Ge)-based alloy, and a gold (Au)/aluminum (Al)-based alloy and a glass material such as low-melting point glass can be used.

It is desirable that an inert gas such as nitrogen, helium, or argon is encapsulated in the housing space S and the housing space S has nearly the atmospheric pressure at a working temperature (approximately −40° C. to 80° C.). By setting the housing space S to the atmospheric pressure, viscous resistance increases and a dumping effect is exerted. Vibration of a movable section 52 can be quickly converged (stopped). Therefore, detection accuracy of the acceleration Ax of the physical quantity sensor 1 is improved.

In this embodiment, such a lid body 10 is configured by a silicon substrate. However, the lid body 10 is not limited to the silicon substrate. For example, a glass substrate or a ceramic substrate may be used. A bonding method for the substrate 2 and the lid body 10 is not particularly limited and only has to be selected as appropriate according to the materials of the substrate 2 and the lid body 10. Examples of the bonding method include anodic bonding, activation bonding for bonding junction surfaces activated by plasma irradiation, bonding by a bonding material such as glass frit, and diffusion bonding for bonding metal films formed on the upper surface of the substrate 2 and the lower surface of the lid body 10.

In this embodiment, as shown in FIG. 2, the substrate 2 and the lid body 10 are bonded via glass frit 19 (low-melting point glass), which is an example of a bonding material. In a state in which the substrate 2 and the lid body 10 are superimposed, the inside and the outside of the housing space S communicate via the groove sections 25, 26, and 27. However, by using the glass frit 19, the substrate 2 and the lid body 10 can be bonded, the groove sections 25, 26, and 27 can be sealed, and the housing space S can be more easily hermetically sealed. Note that, when the substrate 2 and the lid body 10 are bonded by the anodic bonding or the like (i.e., a bonding method that cannot seal the groove sections 25, 26, and 27), for example, the groove sections 25, 26, and 27 can be closed by a $SiO_2$ film formed by a CVD method or the like using TEOS (tetraethoxysilane).

Element Section

As shown in FIGS. 1 and 4, the element section 3 includes a fixed electrode section 4 fixed to the substrate 2, the fixed section 51 fixed to the substrate 2, the movable section 52 displaceable in the X-axis direction with respect to the fixed section 51, spring sections 53 and 54 coupling the fixed section 51 and the movable section 52, and a movable electrode section 6 provided in the movable section 52. Among the sections, the fixed section 51, the movable section 52, the spring sections 53 and 54, and the movable electrode section 6 are integrally formed. In the following explanation, an aggregate of these sections is referred to as "movable body 50" as well.

The element section 3 can be formed by patterning, with etching (in particular, dry etching), a silicon substrate doped with an impurity such as phosphorus (P) or boron (B). The element section 3 is bonded to the substrate 2 (the upper surface of the mount section 211) by the anodic bonding. However, a material of the element section 3 and a method of bonding the element section 3 to the substrate 2 are not particularly limited.

The fixed section 51 is formed in a longitudinal shape extending in the X-axis direction. The fixed section 51 includes a bonding section 511 bonded to the mount section 211 at an end portion on an X-axis direction minus side. Note that the shape of the fixed section 51 is not particularly limited. In the following explanation, an imaginary axis that equally divides the fixed section 51 into two in the Y-axis direction in the plan view from the Z-axis direction is represented as a center axis L.

The fixed section 51 is located between the first fixed electrode section 41 and the second fixed electrode section 42. Consequently, the fixed section 51 can be disposed in the center of the movable section 52. The movable section 52 can be stably supported.

The movable section 52 is formed in a frame shape in the plan view from the Z-axis direction. The movable section 52 surrounds the fixed section 51, the spring sections 53 and 54, and the first and second fixed electrode sections 41 and 42. By forming the movable section 52 in the frame shape in this way, the mass of the movable section 52 can be increased. Therefore, sensitivity is improved and a physical quantity can be accurately detected.

The movable section 52 includes a first opening section 528, on the inner side of which the first fixed electrode section 41 is disposed, and a second opening section 529, on the inner side of which the second fixed electrode section 42 is disposed. The movable section 52 is symmetrical with respect to the center axis L.

The shape of the movable section 52 is more specifically explained. The movable section 52 includes a frame section 521 configured to surround the fixed section 51, the spring sections 53 and 54, and the first and second fixed electrode sections 41 and 42, a first Y-axis extending section 522 located on an X-axis direction plus side of the first opening section 528 and extending from the frame section 521 to a Y-axis direction minus side, a first X-axis extending section 523 extending from the distal end portion of the first Y-axis extending section 522 to the X-axis direction minus side, a second Y-axis extending section 524 located on the X-axis direction plus side of the second opening section 529 and extending from the frame section 521 to a Y-axis direction plus side, and a second X-axis extending section 525 extending from the distal end portion of the second Y-axis extending section 524 to the X-axis direction minus side. The first and second Y-axis extending sections 522 and 524 are respectively provided near the spring section 53 and disposed along the Y-axis direction. The first and second X-axis extending sections 523 and 525 are respectively provided near the fixed section 51 and disposed along the fixed section 51.

In such a configuration, the first Y-axis extending section 522 and the first X-axis extending section 523 function as supporting sections that support first movable electrode fingers 611. The second Y-axis extending section 524 and the second X-axis extending section 525 function as supporting sections that support second movable electrode fingers 621.

The movable section 52 includes a first projecting section 526 projecting from the frame section 521 into the first opening section 528 to fill an excess space of the first opening section 528 and a second projecting section 527 projecting from the frame section 521 into the second opening section 529 to fill an excess space of the second opening section 529. By providing the first and second projecting sections 526 and 527 in this way, it is possible to further increase the mass of the movable section 52 without causing an increase in the size of the movable section 52. Therefore, the physical quantity sensor 1 having higher sensitivity is obtained.

The spring sections 53 and 54 are elastically deformable. The spring sections 53 and 54 are elastically deformed, whereby the movable section 52 can be displaced in the X-axis direction with respect to the fixed section 51. As shown in FIG. 1, the spring section 53 couples the fixed section 51 and the movable section 52 on the X-axis direction plus side. The spring section 54 couples the fixed section 51 and the movable section 52 on the X-axis direction minus side. Consequently, the movable section 52 can be supported on both sides in the X-axis direction. The posture and the behavior of the movable section 52 are stabilized. Therefore, unnecessary vibration in directions other than the X-axis direction decreases. The acceleration Ax can be more accurately detected. Note that the spring sections 53 and 54 are not particularly limited. For example, one of the spring sections 53 and 54 may be omitted.

The fixed electrode section 4 includes the first fixed electrode section 41 located in the first opening section 528 and the second fixed electrode section 42 located in the second opening section 529.

The first fixed electrode section 41 includes a first fixed section 413 fixed to the substrate 2, a first stem section 411 supported by the first fixed section 413, and a plurality of first fixed electrode fingers 412 extending from the first stem section 411 to Y-axis direction both sides. Note that the first fixed section 413, the first stem section 411, and the first fixed electrode fingers 412 are integrally formed.

The first fixed section 413 includes a bonding section 413a bonded to the upper surface of the mount section 211. The bonding section 413a is disposed eccentrically to the X-axis direction minus side of the first fixed section 413.

The first stem section 411 is formed in a bar-like longitudinal shape. One end of the first stem section 411 is connected to the first fixed section 413. The first stem section 411 extends in a direction inclined with respect to each of the X axis and the Y axis in the plan view from the Z-axis direction. Specifically, the first stem section 411 is inclined such that a separation distance between the first stem section 411 and the center axis L increases toward the distal end side of the first stem section 411. By adopting such disposition, the first fixed section 413 is easily disposed near the fixed section 51.

Note that a tilt of an axis L411 of the first stem section 411 with respect to the X axis is not particularly limited. However, the tilt is desirably 10° or more and 45° or less and more desirably 10° or more and 30° or less. Consequently, spread in the Y-axis direction of the first fixed electrode section 41 can be reduced. A reduction in the size of the element section 3 can be achieved.

The first fixed electrode fingers 412 extend from the first stem section 411 to the Y-axis direction both sides. That is, the first fixed electrode fingers 412 include first fixed electrode fingers 412' located on the Y-axis direction plus side of the first stem section 411 and first fixed electrode fingers 412" located on the Y-axis direction minus side. Pluralities of the first fixed electrode fingers 412' and 412" are respectively provided to be separated from one another along the X-axis direction.

The length (the length in the Y-axis direction) of the plurality of first fixed electrode fingers 412' gradually decreases toward the X-axis direction plus side. The distal ends of the plurality of first fixed electrode fingers 412' are respectively located on the same straight line extending along the X-axis direction. On the other hand, the length (the length in the Y-axis direction) of the plurality of first fixed electrode fingers 412" gradually increases toward the X-axis direction plus side. The distal ends of the plurality of first fixed electrode fingers 412" are respectively located on the same straight line extending along the X-axis direction. Total lengths of the first fixed electrode fingers 412' and the first fixed electrode fingers 412" disposed side by side in the Y-axis direction are respectively substantially the same.

The second fixed electrode section 42 includes a second fixed section 423 fixed to the substrate 2, a second stem section 421 supported by the second fixed section 423, and a plurality of second fixed electrode fingers 422 extending from the second stem section 421 to the Y-axis direction both sides. Note that the second fixed section 423, the second stem section 421, and the second fixed electrode fingers 422 are integrally formed.

The second fixed section 423 includes a bonding section 423a bonded to the upper surface of the mount section 211. Note that the bonding section 423a is disposed eccentrically to the X-axis direction minus side of the second fixed section 423.

The second stem section 421 is formed in a bar-like longitudinal shape. One end of the second stem section 421 is connected to the second fixed section 423. The second stem section 421 extends in a direction inclined with respect to each of the X axis and the Y axis in the plan view from the Z-axis direction. More specifically, the second stem section 421 is inclined such that a separation distance between the second stem section 421 and the center axis L increases toward the distal end side of the second stem section 421. By adopting such disposition, the second fixed section 423 is easily disposed near the fixed section 51.

Note that a tilt of an axis L421 of the second stem section 421 with respect to the X axis is not particularly limited. However, the tilt is desirably 10° or more and 45° or less and more desirably 10° or more and 30° or less. Consequently, spread in the Y-axis direction of the second fixed electrode section 42 can be reduced. A reduction in the size of the element section 3 can be achieved.

The second fixed electrode fingers 422 extend from the second stem section 421 to the Y-axis direction both sides. That is, the second fixed electrode fingers 422 include second fixed electrode fingers 422' located on the Y-axis direction plus side of the second stem section 421 and second fixed electrode fingers 422" located on the Y-axis direction minus side. Pluralities of the second fixed electrode fingers 422' and 422" are respectively provided to be separated from one another along the X-axis direction.

The length (the length in the Y-axis direction) of the plurality of second fixed electrode fingers 422' gradually increases toward the X-axis direction plus side. The distal ends of the plurality of second fixed electrode fingers 422' are respectively located on the same straight line extending along the X-axis direction. On the other hand, the length (the length in the Y-axis direction) of the plurality of second fixed electrode fingers 422" gradually decreases toward the X-axis direction plus side. The distal ends of the plurality of second fixed electrode fingers 422" are respectively located on the same straight line extending along the X-axis direction. Total lengths of the second fixed electrode fingers 422' and the second fixed electrode fingers 422" disposed side by side in the Y-axis direction are respectively substantially the same.

The first fixed electrode section 41 and the second fixed electrode section 42 are explained above. The shape and the disposition of the first and second fixed electrode sections 41 and 42 are symmetrical with respect to the center axis L (except that the first and second fixed electrode fingers 412 and 422 deviate in the X-axis direction). In particular, the first and second stem sections 411 and 421 respectively extend in a direction inclined with respect to the X axis such that the separation distance between the first and second stem sections 411 and 421 and the center axis L gradually increases toward the distal end side. Therefore, the bonding section 413a of the first fixed section 413 and the bonding section 423a of the second fixed section 423 can be disposed near the bonding section 511 of the fixed section 51. Therefore, the influence of thermal deflection of the substrate 2 less easily occurs. Specifically, when thermal deflection occurs in the substrate 2, it is possible to more effectively reduce a difference between a deviation amount in the Z-axis direction between the first movable electrode fingers 611 and the first fixed electrode fingers 412 and a deviation amount in the Z-axis direction between the second movable electrode fingers 621 and the second fixed electrode fingers 422.

In particular, in this embodiment, the bonding section 413a of the first fixed section 413, the bonding section 423a of the second fixed section 423, and the bonding section 511 of the fixed section 51 are disposed side by side in the Y-axis direction. Therefore, the bonding sections 413a and 423a can be disposed nearer the bonding section 511. The effects explained above become more conspicuous.

As shown in FIG. 1, the movable electrode section 6 includes a first movable electrode section 61 located in the first opening section 528 and a second movable electrode section 62 located in the second opening section 529.

The first movable electrode section 61 includes a plurality of first movable electrode fingers 611 located on the Y-axis direction both sides of the first stem section 411 and extending in the Y-axis direction. That is, the first movable electrode fingers 611 include first movable electrode fingers 611' located on the Y-axis direction plus side of the first stem section 411 and first movable electrode fingers 611" located on the Y-axis direction minus side. Pluralities of the first movable electrode fingers 611' and 611" are respectively provided to be separated from one another along the X-axis direction. The first movable electrode fingers 611' extend from the frame section 521 toward the Y-axis direction minus side. The first movable electrode fingers 611" extend from the first X-axis extending section 523 toward the Y-axis direction plus side.

The first movable electrode fingers 611 are located on the X-axis direction plus side with respect to the first fixed electrode fingers 412 corresponding to the first movable electrode fingers 611 and are opposed to the first fixed electrode fingers 412 via gaps.

The length (the length in the Y-axis direction) of the plurality of first movable electrode fingers 611' gradually decreases toward the X-axis direction plus side. The distal ends of the plurality of first movable electrode fingers 611' are respectively located on the same straight line extending along the extending direction of the first stem section 411. On the other hand, the length (the length in the Y-axis direction) of the plurality of first movable electrode fingers 611" gradually increases toward the X-axis direction plus side. The distal ends of the plurality of first movable electrode fingers 611" are respectively located on the same straight line extending along the extending direction of the first stem section 411. Total lengths of the first movable electrode fingers 611' and the first movable electrode fingers 611" disposed side by side in the Y-axis direction are respectively substantially the same.

The second movable electrode section 62 includes a plurality of second movable electrode fingers 621 located on the Y-axis direction both sides of the second stem section 421 and extending in the Y-axis direction. That is, the second movable electrode fingers 621 include second movable electrode fingers 621' located on the Y-axis direction plus side of the second stem section 421 and second movable electrode fingers 621" located on the Y-axis direction minus side. Pluralities of the second movable electrode fingers 621' and 621" are respectively provided to be separated from one another along the X-axis direction. The second movable electrode fingers 621' extend from the second X-axis extending section 525 toward the Y-axis direction minus side. The second movable electrode fingers 621" extend from the frame section 521 toward the Y-axis direction plus side.

The second movable electrode fingers 621 are located on the X-axis direction minus side with respect to the second fixed electrode fingers 422 corresponding to the second movable electrode fingers 621 and are opposed to the second fixed electrode fingers 422 via gaps.

The length (the length in the Y-axis direction) of the plurality of second movable electrode fingers 621' gradually increases toward the X-axis direction plus side. The distal ends of the plurality of second movable electrode fingers 621' are respectively located on the same straight line extending along the extending direction of the second stem section 421. On the other hand, the length (the length in the Y-axis direction) of the plurality of second movable electrode fingers 621" gradually decreases toward the X-axis direction plus side. The distal ends of the plurality of second movable electrode fingers 621" are respectively located on the same straight line extending along the extending direction of the second stem section 421. Total lengths of the second movable electrode fingers 621' and the second movable electrode fingers 621" disposed side by side in the Y-axis direction are respectively substantially the same.

The first movable electrode section 61 and the second movable electrode section 62 are explained above. The shape and the disposition of the first and second movable electrode sections 61 and 62 are symmetrical with respect to the center axis L (except that the first and second movable electrode fingers 611 and 621 deviate in the X-axis direction).

During the operation of the physical quantity sensor 1, for example, a voltage V1 shown in FIG. 5 is applied to the movable body 50 and a voltage V2 shown in FIG. 5 is applied to each of the first fixed electrode section 41 and the second fixed electrode section 42. Therefore, capacitance is formed between the first movable electrode fingers 611 and the first fixed electrode fingers 412 and capacitance is formed between the second movable electrode fingers 621 and the second fixed electrode fingers 422.

When the acceleration Ax is applied to the physical quantity sensor 1, the movable section 52 is displaced in the X-axis direction while elastically deforming the spring sections 53 and 54 on the basis of the magnitude of the acceleration Ax. According to such displacement, the gaps between the first movable electrode fingers 611 and the first fixed electrode fingers 412 and the gaps between the second movable electrode fingers 621 and the second fixed electrode fingers 422 respectively change. According to this displacement, the magnitude of the capacitance between the first movable electrode fingers 611 and the first fixed electrode fingers 412 and the magnitude of the capacitance between the second movable electrode fingers 621 and the second fixed electrode fingers 422 respectively change. Therefore, the acceleration Ax can be detected on the basis of the changes of the capacitance.

As explained above, the first movable electrode fingers 611 are located on the X-axis direction plus side with respect to the first fixed electrode fingers 412 corresponding to the first movable electrode fingers 611. Conversely, the second movable electrode fingers 621 are located on the X-axis direction minus side with respect to the second fixed electrode fingers 422 corresponding to the second movable electrode finger 621. Therefore, when the acceleration Ax is applied, the gaps between the first movable electrode fingers 611 and the first fixed electrode fingers 412 decrease in size and the gaps between the second movable electrode fingers 621 and the second fixed electrode fingers 422 increase in size or, conversely, the gaps between the first movable electrode fingers 611 and the first fixed electrode fingers 412 increase in size and the gaps between the second movable electrode fingers 621 and the second fixed electrode fingers 422 decrease in size. Therefore, by performing a differential operation of a first detection signal obtained from between the first fixed electrode fingers 412 and the first movable electrode fingers 611 via the wire 75 and a second detection signal obtained from between the second fixed electrode fingers 422 and the second movable electrode fingers 621 via the wire 76, noise can be cancelled and the acceleration Ax can be more accurately detected.

Note that the width of the first and second movable electrode fingers 611 and 621 and the width of the first and second fixed electrode fingers 412 and 422 are not respectively particularly limited. However, the widths can be set to, for example, 3 μm or more and 10 μm or less. Consequently, it is possible to reduce these widths while maintaining mechanical strength of the first and second movable electrode fingers 611 and 621 and the first and second fixed electrode fingers 412 and 422. Therefore, the first and second movable electrode fingers 611 and 621 and the first and second fixed electrode fingers 412 and 422 can be more densely disposed. Therefore, if the size of the physical quantity sensor 1 is the same, the first and second movable electrode fingers 611 and 621 and the first and second fixed electrode fingers 412 and 422 can be disposed more. Detection accuracy of the acceleration Ax is improved. If the number of the first and second movable electrode fingers 611 and 621 and the first and second fixed electrode fingers 412 and 422 is the same, a further reduction in the size of the physical quantity sensor 1 can be achieve.

The dummy electrode 78 is explained again. As explained above, the dummy electrode 78 is disposed on the bottom surface of the recessed section 21. The dummy electrode 78 is disposed over substantially the entire region of the bottom surface of the recessed section 21 in a state in which the dummy electrode 78 is insulated from the wires 75 and 76. The dummy electrode 78 overlaps substantially the entire region of the movable body 50 in the plan view from the Z-axis direction. As explained above, the dummy electrode 78 is electrically connected to the movable body 50 via the wires 72 and 73. The dummy electrode 78 has the same potential as the potential of the movable body 50. Therefore, the dummy electrode 78 can exert effects explained below.

As explained above, when an electric field acts on the substrate 2 according to the application of the voltage V1 to the movable body 50 and a movable ion (Na⁺) in the substrate 2 moves, the bottom surface of the recessed section 21 is charged and the surface potential of the bottom surface of the recessed section 21 changes. Consequently, electrostatic attraction occurs between the bottom surface of the recessed section 21 and the movable body 50. The movable body 50 is attracted to the substrate 2 by the electrostatic attraction. The movable body 50 is displaced in the Z-axis direction. As a result, drift of an output occurs. Further, "sticking" in which the movable body 50 attracted to the substrate 2 by the electrostatic attraction adheres to the bottom surface of the recessed section 21 occurs. The physical quantity sensor 1 sometimes does not function as the acceleration sensor. Therefore, to prevent exposure of the bottom surface of the recessed section 21, the dummy electrode 78 having the same potential as the potential of the movable body 50 is disposed in the position opposed to the movable body 50. This reduces the influence of the charging of the bottom surface of the recessed section 21 and prevents the problems described above from easily occurring.

Restricting Section

As shown in FIG. 1, the restricting section 9 configured to restrict a movable range of the movable section 52 is disposed around the movable section 52. The restricting section 9 can be formed by patterning, with etching (in particular, dry etching), a silicon substrate doped with an impurity such as phosphorus (P) or boron (B). That is, the restricting section 9 is made of the same material as the material of the element section 3. The restricting section 9 is bonded to the upper surface of the substrate 2 by the anodic bonding.

In particular, in this embodiment, by patterning, with etching, a silicon substrate bonded to the upper surface of the substrate 2, the element section 3 and the restricting section 9 are collectively formed from the silicon substrate. Consequently, it is easy to position the element section 3 and the restricting section 9. Deviation from design values of the element section 3 and the restricting section 9 can be reduced. However, a material of the restricting section 9, a method of forming the restricting section 9, a method of bonding the restricting section 9 to the substrate 2, and the like are not particularly limited.

As shown in FIG. 1, the frame section 521 of the movable section 52 includes a first outer edge portion 521a located on the X-axis direction plus side of the fixed section 51 and disposed along the Y-axis direction, a second outer edge portion 521b located on the X-axis direction minus side of the fixed section 51 and disposed along the Y-axis direction, a third outer edge portion 521c located on the Y-axis direction plus side of the fixed section 51 and disposed along the X-axis direction, and a fourth outer edge portion 521d located on the Y-axis direction minus side of the fixed section 51 and disposed along the X-axis direction.

The restricting section 9 includes a first restricting section 91 located on the X-axis direction plus side of the first outer edge portion 521a and disposed to be opposed to the first outer edge portion 521a via a gap, a second restricting section 92 located on the X-axis direction minus side of the second outer edge portion 521b and disposed to be opposed to the second outer edge portion 521b via a gap, a third restricting section 93 located on the Y-axis direction plus side of the third outer edge portion 521c and disposed to be opposed to the third outer edge portion 521c via a gap, and a fourth restricting section 94 located on the Y-axis direction minus side of the fourth outer edge portion 521d and disposed to be opposed to the fourth outer edge portion 521d via a gap.

The movable section 52 comes into contact with the first restricting section 91, whereby displacement of the movable section 52 in the X-axis direction plus side is restricted. The movable section 52 comes into contact with the second restricting section 92, whereby displacement of the movable section 52 to the X-axis direction minus side is restricted. The movable section 52 comes into contact with the third restricting section 93, whereby displacement of the movable section 52 in the Y-axis direction plus side is restricted. The movable section 52 comes into contact with the fourth restricting section 94, whereby displacement of the movable section 52 in the Y-axis direction minus side is restricted. With the restricting section 9, while allowing displacement (displacement in the X-axis direction) for detection of the movable section 52, it is possible to prevent excessive displacement other than the displacement. Therefore, excessive stress does not occur in the element section 3. Damage to the element section 3 can be reduced. The physical quantity sensor 1 having excellent shock resistance is obtained.

The first restricting section 91 is disposed to extend in the Y-axis direction along the outer edge of the first outer edge portion 521a. Consequently, when the movable section 52 is displaced to the X-axis direction plus side, the movable section 52 can be more surely brought into contact with the first restricting section 91. A side surface 521a' of the first outer edge portion 521a and a contact surface 91' (a surface opposed to the side surface 521a') of the first restricting section 91 are respectively formed by YZ planes. Therefore, when the movable section 52 is displaced to the X-axis direction plus side, the first restricting section 91 and the first outer edge portion 521a come into surface contact. Consequently, a contact area of the first restricting section 91 and the first outer edge portion 521a increases. A shock of the contact is dispersed. Damage to the first restricting section 91 and the first outer edge portion 521a can be effectively reduced. However, the first restricting section 91 and the first outer edge portion 521a may come into line contact or may come into point contact.

Note that, in the first restricting section 91 and the first outer edge portion 521a, widths in the X-axis direction are desirably respectively 15 μm or more and 100 μm or less. Consequently, mechanical strength of the first restricting section 91 and the first outer edge portion 521a is sufficiently high. Damage during the contact can be effectively reduced. Note that the widths in the X-axis direction of the first restricting section 91 and the first outer edge portion 521a may be the same or may be different.

The second restricting section 92 is disposed to extend in the Y-axis direction along the outer edge of the second outer edge portion 521b. Consequently, when the movable section 52 is displaced in the X-axis direction minus side, the movable section 52 can be more surely brought into contact with the second restricting section 92. A side surface 521b' of the second outer edge portion 521b and a contact surface 92' (a surface opposed to the side surface 521b') of the second restricting section 92 are respectively formed by YZ planes. Therefore, when the movable section 52 is displaced to the X-axis direction minus side, the second restricting section 92 and the second outer edge portion 521*b* come into surface contact. Consequently, a contact area of the second restricting section 92 and the second outer edge portion 521*b* increases. A shock of the contact is dispersed. Damage to the second restricting section 92 and the second outer edge portion 521*b* can be effectively reduced. However, the second restricting section 92 and the second outer edge portion 521*b* may come into line contact or may come into point contact.

Note that, in the second restricting section 92 and the second outer edge portion 521*b*, widths in the X-axis direction are desirably respectively 15 µm or more and 100 µm or less. Consequently, mechanical strength of the second restricting section 92 and the second outer edge portion 521*b* is sufficiently high. Damage during the contact can be effectively reduced. Note that the widths in the X-axis direction of the second restricting section 92 and the second outer edge portion 521*b* may be the same or may be different.

The third restricting section 93 is disposed to extend in the X-axis direction along the outer edge of the third outer edge portion 521*c*. Consequently, when the movable section 52 is displaced in the Y-axis direction plus side, the movable section 52 can be more surely brought into contact with the third restricting section 93. The third restricting section 93 includes a first portion 93A located on the X-axis direction plus side and connected to the end portion on the Y-axis direction plus side of the first restricting section 91 and a second portion 93B located on the X-axis direction minus side and connected to the end portion on the Y-axis direction plus side of the second restricting section 92. A gap 93C is provided between the first and second portions 93A and 93B. By providing the gap 93C, compared with when the gap 93C is absent, a bonding area of the third restricting section 93 and the substrate 2 can be reduced. Therefore, thermal deflection of the substrate 2 due to a difference between coefficients of thermal expansion of the restricting section 9 and the substrate 2 can be reduced.

A side surface 521*c*' of the third outer edge portion 521*c* and a contact surface 93' (a surface opposed to the side surface 521*c*') of the third restricting section 93 are respectively formed by XZ planes. Therefore, when the movable section 52 is displaced to the Y-axis direction plus side, the third restricting section 93 and the third outer edge portion 521*c* come into surface contact. Consequently, a contact area of the third restricting section 93 and the third outer edge portion 521*c* increases. A shock of the contact is dispersed. Damage to the third restricting section 93 and the third outer edge portion 521*c* can be effectively reduced. However, the third restricting section 93 and the third outer edge portion 521*c* may come into line contact or may come into point contact.

Note that, in the third restricting section 93 and the third outer edge portion 521*c*, widths in the Y-axis direction are desirably respectively 10 µm or more and 100 µm or less. Consequently, mechanical strength of the third restricting section 93 and the third outer edge portion 521*c* is sufficiently high. Damage during the contact can be effectively reduced. Note that the widths in the Y-axis direction of the third restricting section 93 and the third outer edge portion 521*c* may be the same or may be different.

The fourth restricting section 94 is disposed to extend in the X-axis direction along the outer edge of the fourth outer edge portion 521*d*. Consequently, when the movable section 52 is displaced in the Y-axis direction minus side, the movable section 52 can be more surely brought into contact with the fourth restricting section 94. The fourth restricting section 94 includes a first portion 94A located on the X-axis direction plus side and connected to the end portion on the Y-axis direction minus side of the first restricting section 91 and a second portion 94B located on the X-axis direction minus side and connected to the end portion on the Y-axis direction minus side of the second restricting section 92. A gap 94C is provided between the first and second portions 94A and 94B. By providing the gap 94C, compared with when the gap 94C is absent, a bonding area of the fourth restricting section 94 and the substrate 2 can be reduced. Therefore, thermal deflection of the substrate 2 due to a difference between coefficients of thermal expansion of the restricting section 9 and the substrate 2 can be reduced.

A side surface 521*d*' of the fourth outer edge portion 521*d* and a contact surface 94' (a surface opposed to the side surface 521*d*') of the fourth restricting section 94 are respectively formed by XZ planes. Therefore, when the movable section 52 is displaced to the Y-axis direction minus side, the fourth restricting section 94 and the fourth outer edge portion 521*d* come into surface contact. Consequently, a contact area of the fourth restricting section 94 and the fourth outer edge portion 521*d* increases. A shock of the contact is dispersed. Damage to the fourth restricting section 94 and the fourth outer edge portion 521*d* can be effectively reduced. However, the fourth restricting section 94 and the fourth outer edge portion 521*d* may come into line contact or may come into point contact.

Note that, in the fourth restricting section 94 and the fourth outer edge portion 521*d*, widths in the Y-axis direction are desirably respectively 10 µm or more and 100 µm or less. Consequently, mechanical strength of the fourth restricting section 94 and the fourth outer edge portion 521*d* is sufficiently high. Damage during the contact can be effectively reduced. Note that the widths in the Y-axis direction of the fourth restricting section 94 and the fourth outer edge portion 521*d* may be the same or may be different.

A gap (a separation distance along the X-axis direction) between the first movable electrode finger 611 and the first fixed electrode finger 412 paired with each other and a gap (a separation distance along the X-axis direction) between the second movable electrode finger 621 and the second fixed electrode finger 422 paired with each other are respectively represented as G1, a gap (a separation distance along the X-axis direction) between the first outer edge portion 521*a* and the first restricting section 91 is represented as G2, and a gap (a separation distance along the X-axis direction) between the second outer edge portion 521*b* and the second restricting section 92 is represented as G3. Then, G1, G2, and G3 satisfy relations of G1>G2 and G1>G3.

Consequently, when the movable section 52 is displaced in the X-axis direction, the movable section 52 and the first restricting section 91 or the second restricting section 92 come into contact before the first movable electrode finger 611 and the first fixed electrode finger 412 paired with each other come into contact the second movable electrode finger 621 and the second fixed electrode finger 422 paired with each other come into contact. Therefore, it is possible to surely reduce contact of the first movable electrode finger 611 and the first fixed electrode finger 412 paired with each other and the second movable electrode finger 621 and the second fixed electrode finger 422 paired with each other. It is possible to effectively reduce damage to the first and second movable electrode fingers 611 and 621 and the first and second fixed electrode fingers 412 and 422 and a short circuit of the first movable electrode finger 611 and the first fixed electrode finger 412 and a short circuit of the second movable electrode finger 621 and the second fixed electrode finger 422.

Note that G1, G2, and G3 desirably satisfy relations of 1.0<G1/G2<4.0 and 1.0<G1/G3<4.0 and more desirably satisfy relations of 1.0<G1/G2<1.5 and 1.0<G1/G3<1.5. Consequently, the effects explained above become more conspicuous. Specific values of G1, G2, and G3 are not particularly limited. However, for example, G1 can be set to approximately 2.5 µm and G2 and G3 can be respectively set to approximately 1.7 µm.

The configuration of the restricting section 9 is explained above. The restricting section 9 includes the first portion 9A in which the first restricting section 91 and the first portions 93A and 94A are integrated and the second portion 9B in which the second restricting section 92 and the second portions 93B and 94B are integrated. The first portion 9A is electrically connected to the dummy electrode 78 via the conductive bump B3 and the wire 73. The second portion 9B is electrically connected to the dummy electrode 78 via the conducive bump B2 and the wire 72. Further, the second portion 9B is electrically connected to the movable body 50 via the conductive bump B41, the wire 74, and the conductive bump B42. Therefore, the first portion 9A and the second portion 9B respectively have the same potential as the potential of the movable body 50. Consequently, parasitic capacitance could not occur between the restricting section 9 and the movable body 50. Deterioration in detection accuracy due to the parasitic capacitance can be effectively reduced. Electrostatic attraction could not occur between the movable body 50 and the restricting section 9. Unintended displacement of the movable section 52 by the electrostatic attraction is prevented. Therefore, drift of an output can be prevented.

The wires 75 and 76 are respectively disposed to cross (extend across) the second portion 9B of the restricting section 9. Specifically, as shown in FIG. 6, the wires 75 and 76 are disposed in the groove sections 25 and 26 and pass below the second portion 9B in non-contact with the second portion 9B. By causing the wires 75 and 76 to cross the restricting section 9, flexibility of drawing-around of the wires 75 and 76 is improved. Therefore, compared with a configuration in which the wires 75 and 76 do not cross the restricting section 9, for example, a configuration in which the wire 75 is drawn around to the inside and the outside of the restricting section 9 via the gap 93C and the wire 76 is drawn around to the inside and the outside of the restricting section 9 via the gap 94C, a wiring length of the wires 75 and 76 can be reduced. Therefore, for example, cost can be reduced and parasitic capacitance due to the wires 75 and 76 can be reduced.

In portions where the wires 75 and 76 cross the second portion 9B, both the wires 75 and 76 extend in the X-axis direction. The widths of the wires 75 and 76 are substantially equal to each other. That is, opposed areas to the second portion 9B of the wires 75 and 76 are substantially equal to each other. Separation distances from the second portion 9B of the wires 75 and 76 are also substantially equal to each other. Therefore, parasitic capacitance Cm formed between the wire 75 and the second portion 9B and parasitic capacitance Cn formed between the wire 76 and the second portion 9B are substantially equal. Therefore, as explained above, by performing a differential operation of a first detection signal obtained via the wire 75 and a second detection signal obtained via the wire 76, the parasitic capacitance Cm and the parasitic capacitance Cn are cancelled. Therefore, the acceleration Ax can be more accurately detected. Note that Cm/Cn is not particularly limited. However, Cm/Cn is desirably 0.9 or more and 1.1 or less and more desirably 0.95 or more and 1.05 or less. Consequently, the effects explained above become more conspicuous.

Note that, if the parasitic capacitance Cm and the parasitic capacitance Cn are substantially equal, for example, the opposed area of the wire 75 and the second portion 9B may be smaller than the opposed area of the wire 76 and the second portion 9B and the separation distance between the wire 75 and the second portion 9B may be shorter than the separation distance between the wire 76 and the second portion 9B. Naturally, the opposed areas and the separation distances may be opposite to those explained above.

The physical quantity sensor 1 is explained in detail above. The physical quantity sensor 1 includes the substrate 2, the movable section 52 displaceable in the X-axis direction (a first direction) with respect to the substrate 2, the first movable electrode section 61 and the second movable electrode section 62 provided in the movable section 52, the first fixed electrode section 41 fixed to the substrate 2 and disposed to be opposed to the first movable electrode section 61 in the X-axis direction, the second fixed electrode section 42 fixed to the substrate 2 and disposed to be opposed to the second movable electrode section 62 in the X-axis direction, the restricting section 9 configured to restrict the movable range in the X-axis direction of the movable section 52, the wire 75 (a first wire) provided on the substrate 2 and electrically connected to the first fixed electrode section 41, and the wire 76 (a second wire) provided on the substrate 2 and electrically connected to the second fixed electrode section 42. The wire 75 and the wire 76 respectively cross the restricting section 9 in the plan view of the substrate 2.

With such a configuration, the movable section 52 and the restricting section 9 come into contact, whereby excessive displacement of the movable section 52 is prevented. Therefore, the physical quantity sensor 1 having excellent shock resistance is obtained. Flexibility of drawing-around of the wires 75 and 76 is improved. Therefore, compared with the configuration in which the wires 75 and 76 do not cross the restricting section 9, wiring length of the wires 75 and 76 can be reduced. A region where the wires 75 and 76 are disposed can be reduced in size. Therefore, a region allocated to the element section 3 increases in size. As a result, it is possible to increase the element section 3 in size while keeping the size of the physical quantity sensor 1. Improvement of sensitivity of the physical quantity sensor 1 can be achieved. Further, for example, cost can be reduced and parasitic capacitance due to the wires 75 and 76 can be reduced.

As explained above, in the physical quantity sensor 1, the movable section 52 and the restricting section 9 are electrically connected. Consequently, parasitic capacitance could not occur between the restricting section 9 and the movable section 52. Deterioration in detection accuracy due to the parasitic capacitance can be effectively reduced. Electrostatic attraction could not occur between the movable section 52 and the restricting section 9. Unintended displacement of the movable section 52 by the electrostatic attraction is prevented. Therefore, drift of an output can be prevented.

As explained above, the physical quantity sensor 1 includes the dummy electrode 78 disposed on the substrate 2 to overlap at least a part of the movable section 52 in the plan view and electrically connected to the movable section 52. Consequently, it is possible to effectively prevent a situation in which electrostatic attraction occurs between the substrate 2 and the movable section 52 and the movable section 52 is attracted to the substrate 2 to be displaced. As a result, drift of an output can be prevented. Further, "sticking" in which the movable section 52 attracted to the substrate 2 by the electrostatic attraction adheres to the substrate 2 can be effectively prevented.

The physical quantity sensor 1 in this embodiment is explained above. Note that the physical quantity sensor 1 is not limited to this. For example, the restricting section 9 only has to be able to restrict at least one of the movable range in the X-axis direction and the movable range in the Y-axis direction of the movable section 52. That is, if the restricting section 9 includes at least one of the first restricting section 91, the second restricting section 92, the third restricting section 93, and the fourth restricting section 94, the other restricting sections may be omitted.

Second Embodiment

A physical quantity sensor according to a second embodiment of the invention is explained.

Figure 7:
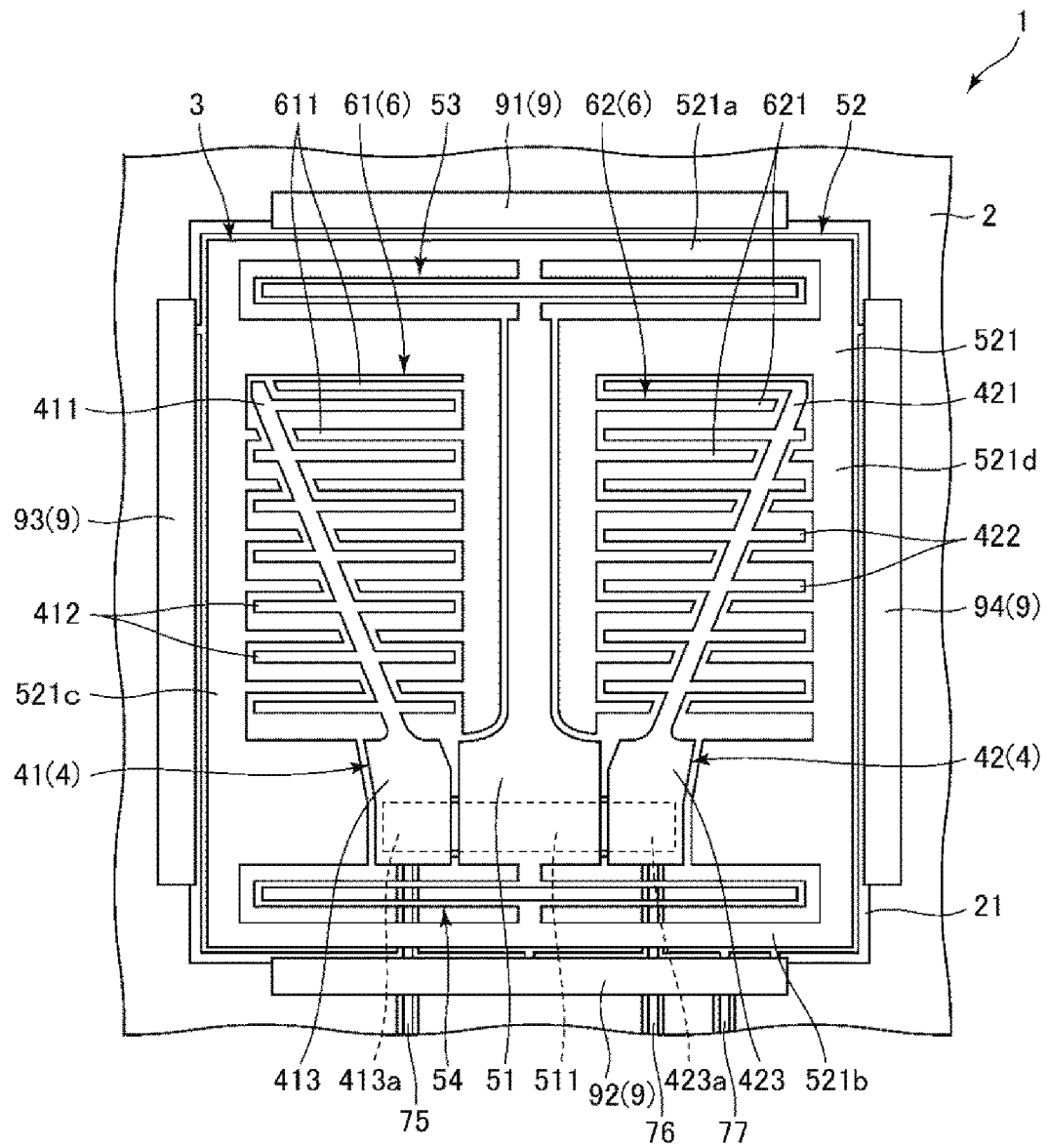
FIG. 7 is a plan view showing a physical quantity sensor according to a second embodiment of the invention.
Figure 8:
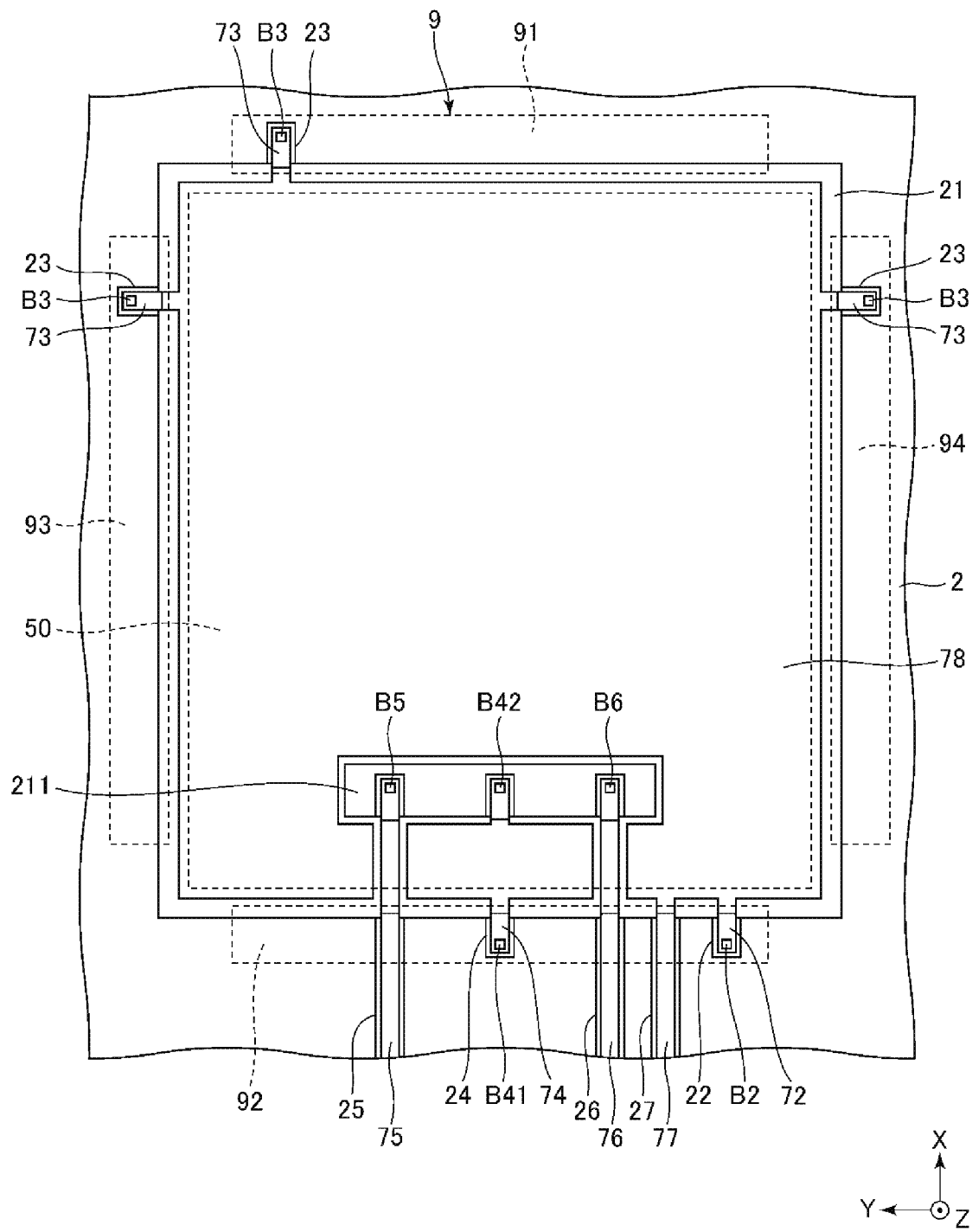
FIG. 8 is a plan view showing a substrate included in the physical quantity sensor shown in FIG. 7.

FIG. 7 is a plan view showing the physical quantity sensor according to the second embodiment of the invention. FIG. 8 is a plan view showing a substrate included in the physical quantity sensor shown in FIG. 7.

The physical quantity sensor 1 according to this embodiment is the same as the physical quantity sensor 1 according to the first embodiment mainly except that the configuration of the restricting section 9 is different.

Note that, in the following explanation, concerning the physical quantity sensor 1 according to the second embodiment, differences from the first embodiment explained above are mainly explained. Explanation of the similarities is omitted. In FIGS. 7 and 8, the same components as the components in the first embodiment explained above are denoted by the same reference numerals and signs.

As shown in FIG. 7, in the restricting section 9 in this embodiment, the first restricting section 91, the second restricting section 92, the third restricting section 93, and the fourth restricting section 94 are disposed independently from one another. The first restricting section 91, the second restricting section 92, the third restricting section 93, and the fourth restricting section 94 are disposed avoiding corners of the frame section 521. Therefore, even if the movable section 52 is displaced in the X-axis direction or the Y-axis direction and comes into contact with the restricting section 9, the corners of the frame section 521 less easily come into contact with the restricting section 9. The corners are parts that are easily broken. Therefore, by preventing contact with such parts, it is possible to effectively prevent damage to the frame section 521 due to contact with the restricting section 9.

As shown in FIG. 8, the first restricting section 91, the third restricting section 93, and the fourth restricting section 94 are respectively electrically connected to the dummy electrode 78 via the conductive bump B3 and the wire 73. The second restricting section 92 is electrically connected to the dummy electrode 78 via the conductive bump B2 and the wire 72. The second restricting section 92 is electrically connected to the movable body 50 via the conductive bump B41, the wire 74, and the conductive bump B42. Therefore, the first restricting section 91, the third restricting section 93, and the fourth restricting section 94 respectively have the same potential as the potential of the dummy electrode 78 and the movable body 50.

According to the second embodiment, the same effects as the effects of the first embodiment explained above can be exerted.

Third Embodiment

A physical quantity sensor according to a third embodiment of the invention is explained.

Figure 9:
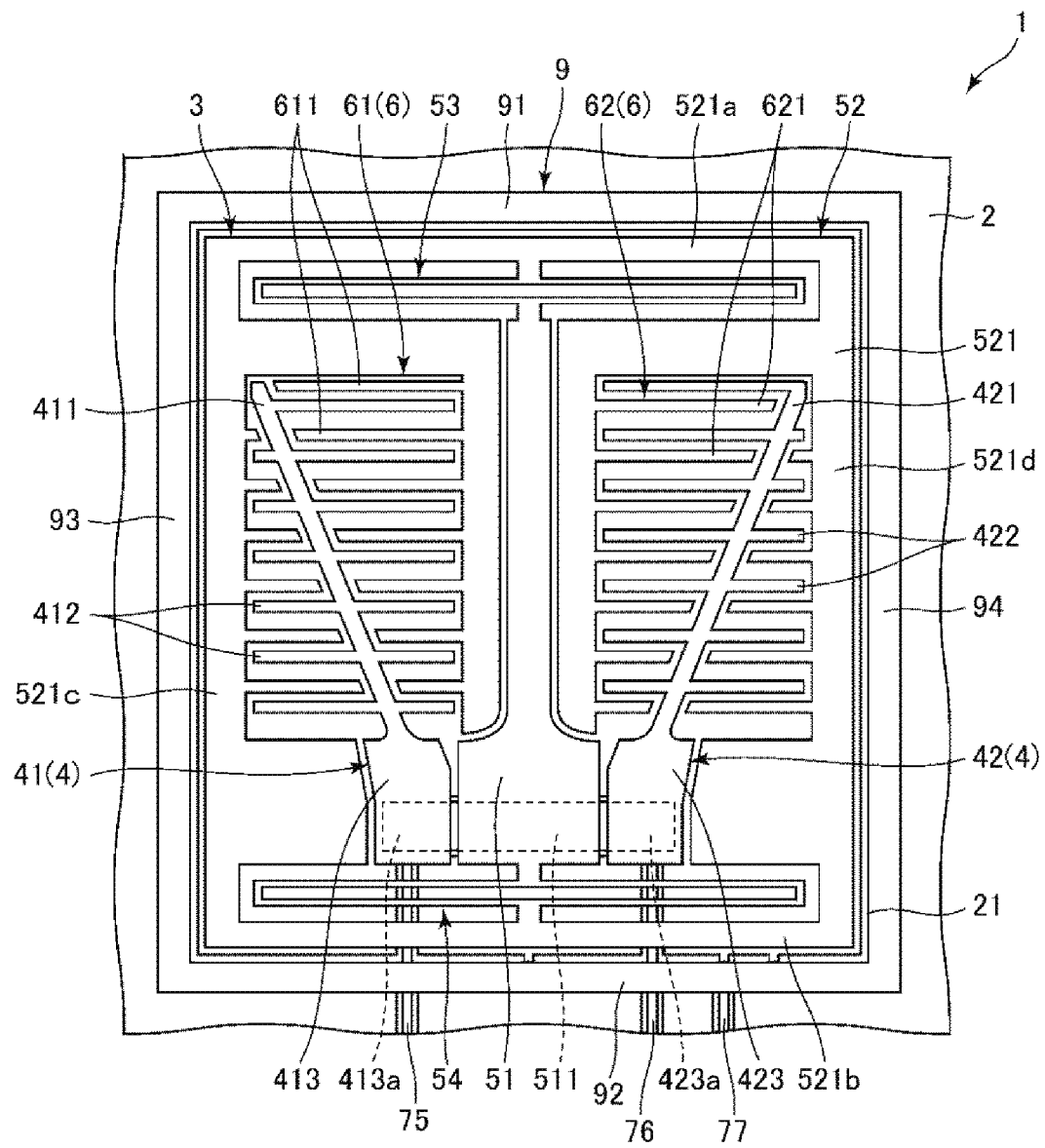
FIG. 9 is a plan view showing a physical quantity sensor according to a third embodiment of the invention.
Figure 10:
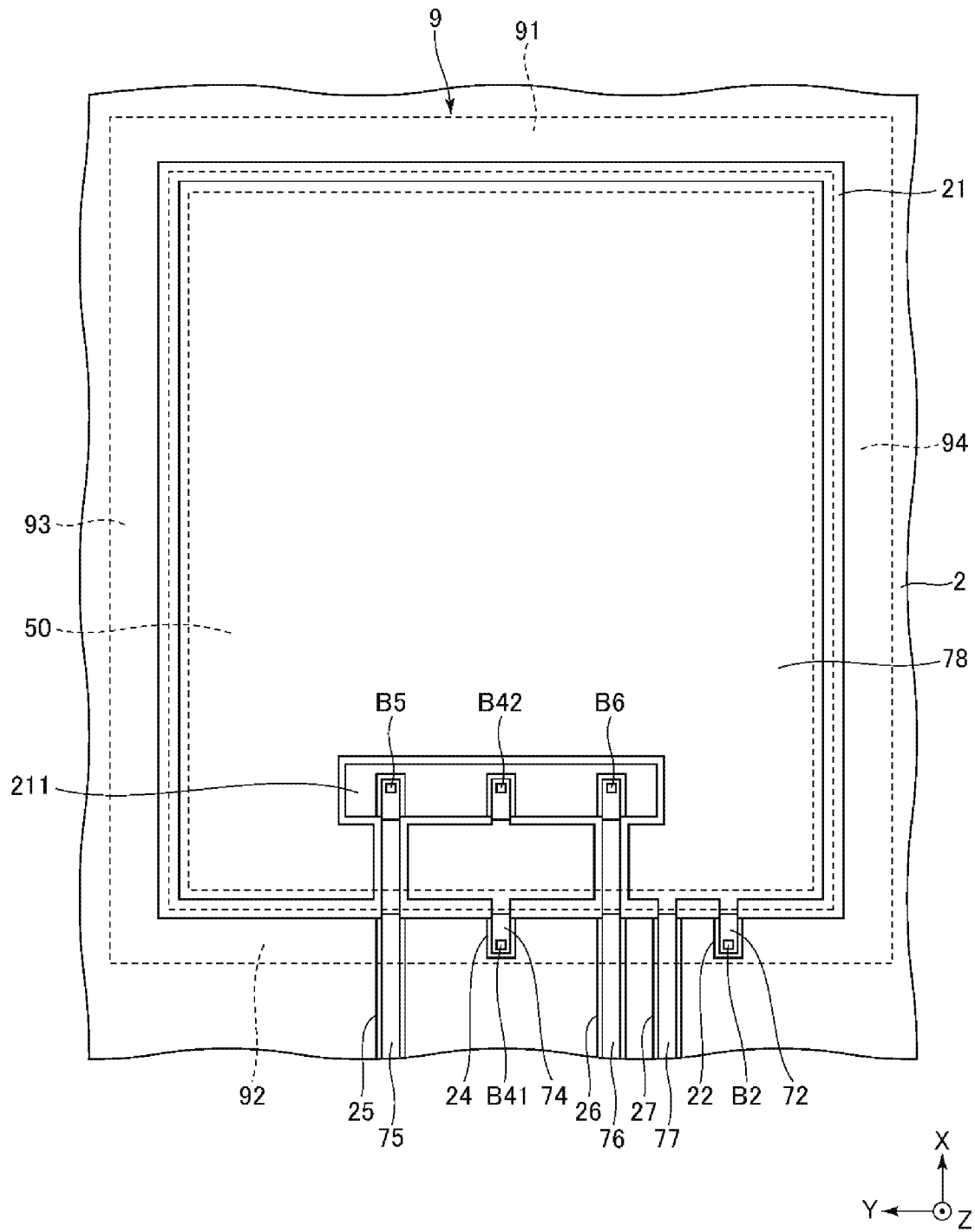
FIG. 10 is a plan view showing a substrate included in the physical quantity sensor shown in FIG. 9.

FIG. 9 is a plan view showing the physical quantity sensor according to the third embodiment of the invention. FIG. 10 is a plan view showing a substrate included in the physical quantity sensor shown in FIG. 9.

The physical quantity sensor 1 according to this embodiment is the same as the physical quantity sensor 1 according to the first embodiment mainly except that the configuration of the restricting section 9 is different.

Note that, in the following explanation, concerning the physical quantity sensor 1 according to the third embodiment, differences from the first embodiment explained above are mainly explained. Explanation of the similarities is omitted. In FIGS. 9 and 10, the same components as the components in the first embodiment explained above are denoted by the same reference numerals and signs.

As shown in FIG. 9, the restricting section 9 in this embodiment is formed in a frame shape. The first restricting section 91, the second restricting section 92, the third restricting section 93, and the fourth restricting section 94 are integrally formed. As shown in FIG. 10, the restricting section 9 is electrically connected to the dummy electrode 78 via the conductive bump B2 and the wire 72 and electrically connected to the movable body 50 via the conductive bump B41, the wire 74, and the conductive bump B42. Therefore, the restricting section 9 has the same potential as the potential of the dummy electrode 78 and the movable body 50.

According to the third embodiment, the same effects as the effects in the first embodiment explained above can be exerted.

Fourth Embodiment

A physical quantity sensor according to a fourth embodiment of the invention is explained.

Figure 11:
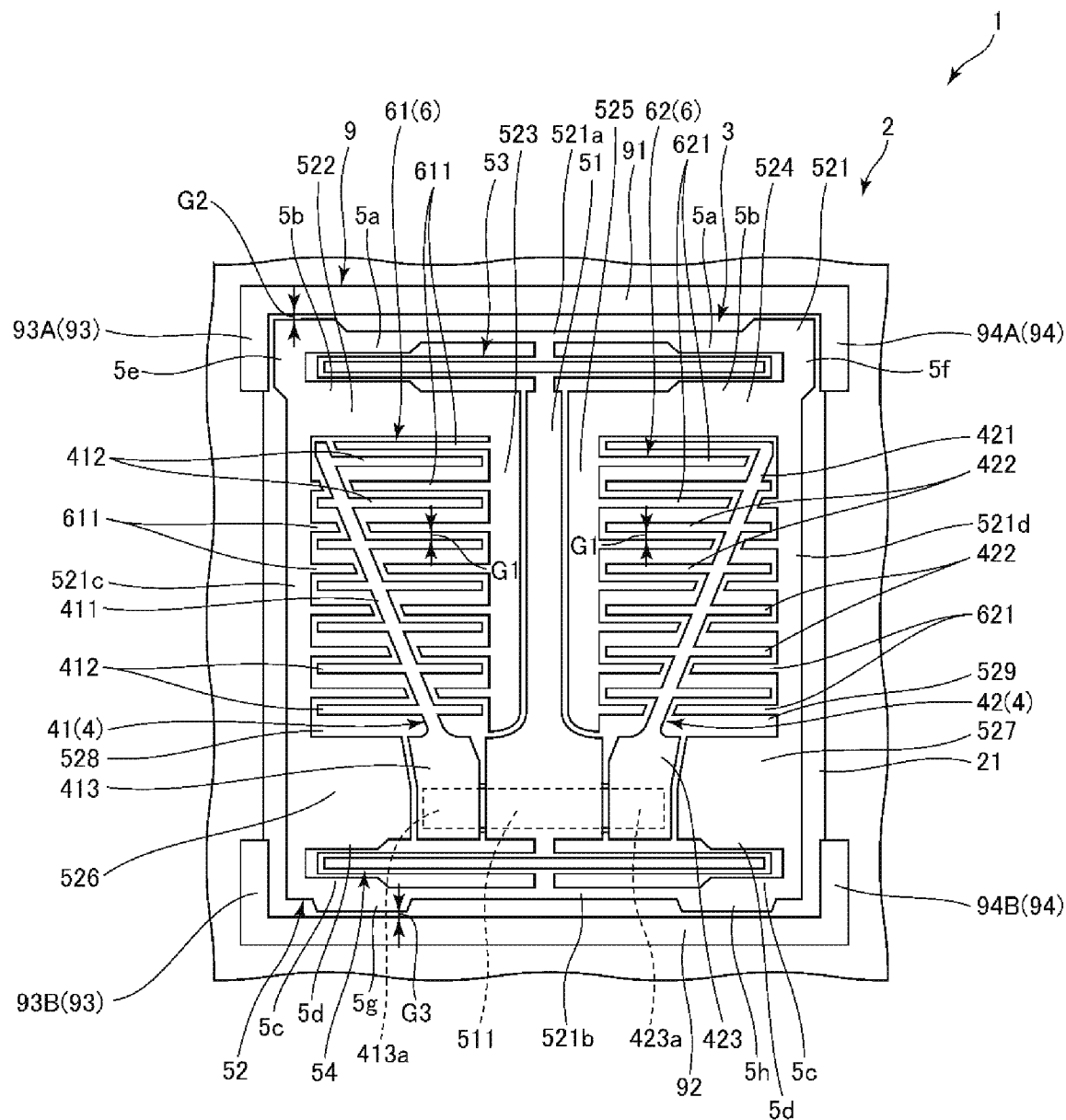
FIG. 11 is a plan view showing a physical quantity sensor according to a fourth embodiment of the invention.
Figure 11:
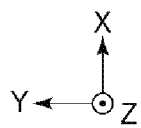

FIG. 11 is a plan view showing the physical quantity sensor according to the fourth embodiment of the invention.

The physical quantity sensor 1 according to this embodiment is the same as the physical quantity sensor 1 according to the first embodiment mainly except that the configuration of the element section 3 is different.

Note that, in the following explanation, concerning the physical quantity sensor 1 according to the fourth embodiment, differences from the first embodiment explained above are mainly explained. Explanation of the similarities is omitted. In FIG. 11, the same components as the components in the first embodiment explained above are denoted by the same reference numerals and signs.

As shown in FIG. 11, the movable section 52 includes a pair of projecting sections 5a projecting from the first outer edge portion 521a toward the spring section 53 and a pair of projecting sections 5b projecting from the first and second Y-axis extending sections 522 and 524 toward the spring section 53. Therefore, the spring section 53 is disposed to be held between the pair of projecting sections 5a and the pair of projecting sections 5b. The movable section 52 includes a pair of projecting sections 5c projecting from the frame section 521 (the second outer edge portion 521b) toward the spring section 54 and a pair of projecting sections 5d projecting from the first and second projecting sections 526 and 527 toward the spring section 54. Therefore, the spring section 54 is disposed to be held between the pair of projecting sections 5c and the pair of projecting sections 5d.

When the movable section 52 is excessively displaced in the X-axis direction, the projecting sections 5a, 5b, 5c, and 5d come into contact with the spring sections 53 and 54 to function as stoppers that restrict displacement of the spring sections 53 and 54. Folded-back portions (distal end portions) of the spring sections 53 and 54 are extremely easily displaced when a strong shock is applied thereto. Therefore, by providing the projecting sections 5a, 5b, 5c, and 5d, the excessive displacement of the spring sections 53 and 54 can be reduced and damage to the spring sections 53 and 54 can be reduced. Therefore, the physical quantity sensor 1 having excellent shock resistance is obtained.

The movable section 52 includes an L-shaped projecting section 5e projecting from a corner (a corner located on the upper left in FIG. 11), where the first outer edge portion 521a and the third outer edge portion 521c cross, toward the outer side of the movable section 52 and formed across the first outer edge portion 521a and the third outer edge portion 521c and an L-shaped projecting section 5f projecting from a corner (a corner located on the upper right in FIG. 11), where the first outer edge portion 521a and the fourth outer edge portion 521d cross, toward the outer side of the movable section 52 and formed across the first outer edge portion 521a and a fourth outer edge portion 521d. The movable section 52 includes a pair of projecting sections 5g and 5h projecting from the second outer edge portion 521b toward the outer side of the movable section 52.

When the movable section 52 is excessively displaced in the surface direction, the projecting sections 5e, 5f, 5g, and 5h come into contact with the restricting section 9, whereby the excessive displacement of the movable section 52 is restricted. The first outer edge portion 521a side, which is a side of the movable section 52 far from the fixed section 51 (the bonding section 511) (the X-axis direction plus side), is easily rotationally displaced around the Z axis in a twisting manner. Therefore, the L-shaped projecting sections 5e and 5f are provided at two corners located on the X-axis direction plus side of the movable section 52. Consequently, the rotational displacement of the movable section 52 can be effectively reduced. On the other hand, the second outer edge portion 521b side, which is a side of the movable section 52 close to the fixed section 51 (the bonding section 511) is easily linearly displaced in the X-axis direction. Therefore, the projecting sections 5g and 5h projecting to the X-axis direction are provided at the second outer edge portion 521b located on the X-axis direction minus side of the movable section 52. Consequently, the linear displacement in the X-axis direction of the movable section 52 can be effectively reduced.

According to the fourth embodiment, the same effects as the effects in the first embodiment can be exerted.

Fifth Embodiment

A physical quantity sensor according to a fifth embodiment of the invention is explained.

Figure 12:
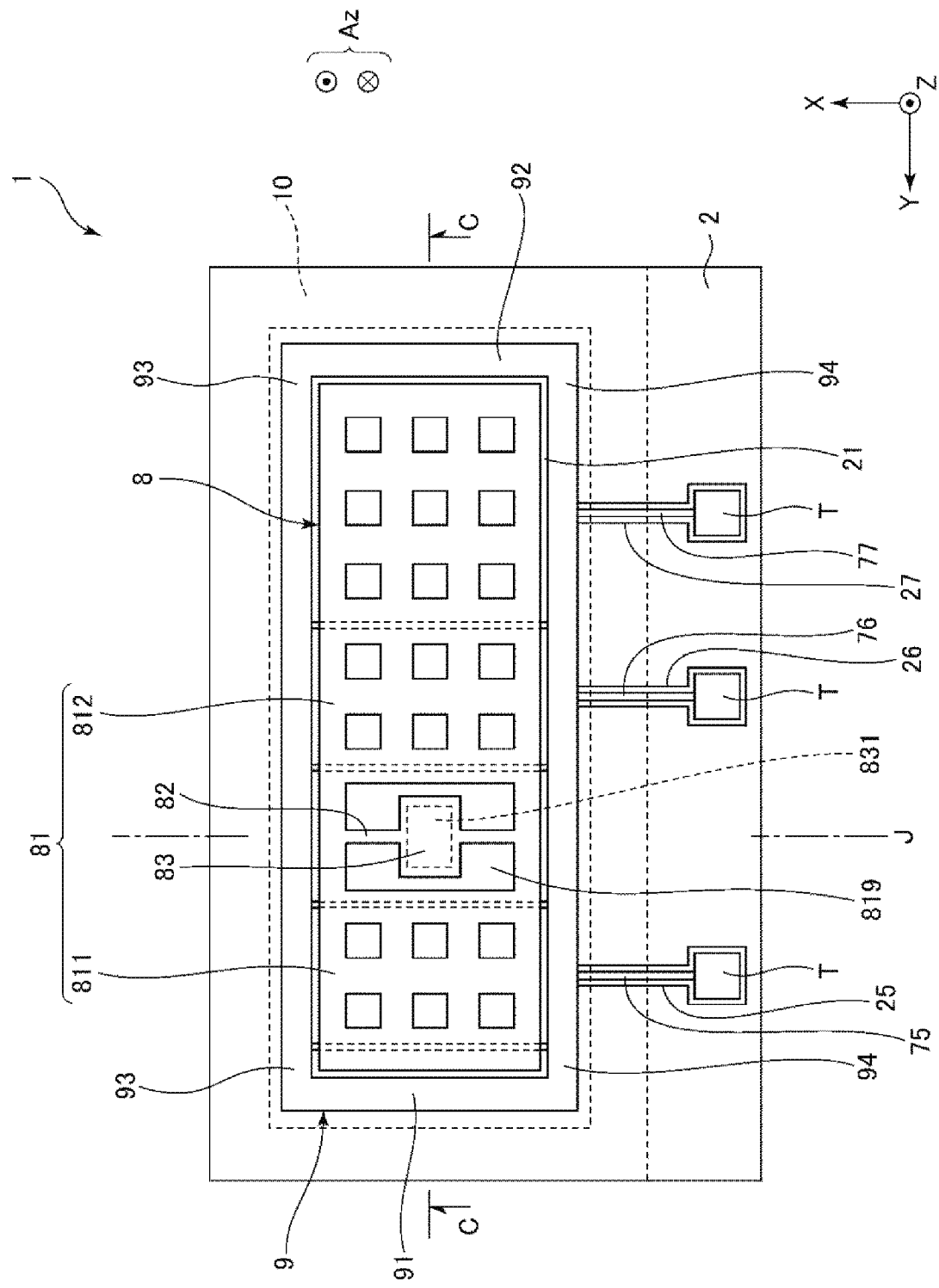
FIG. 12 is a plan view showing a physical quantity sensor according to a fifth embodiment of the invention.
Figure 13:
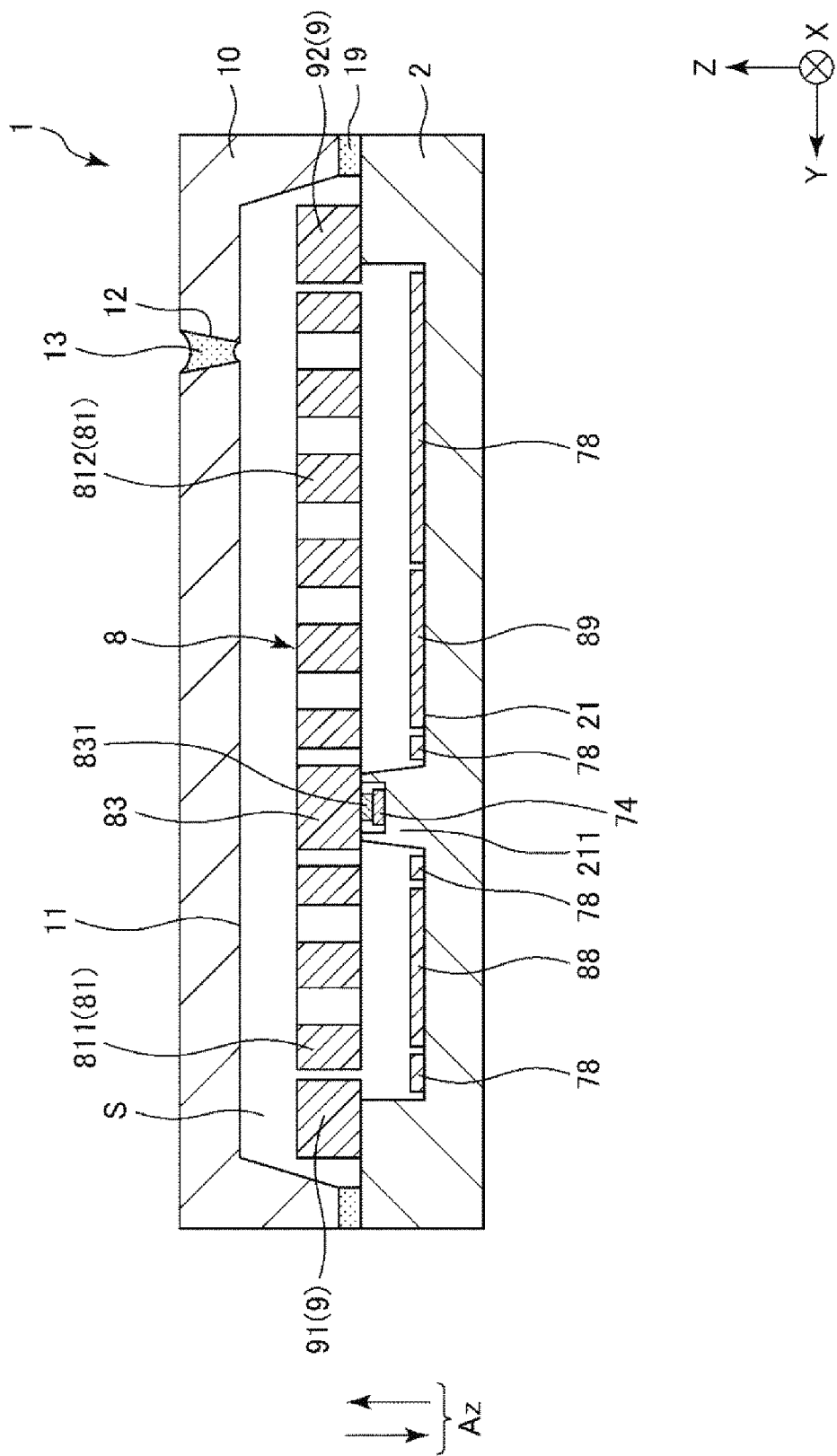
FIG. 13 is a C-C line sectional view in FIG. 12.
Figure 14:
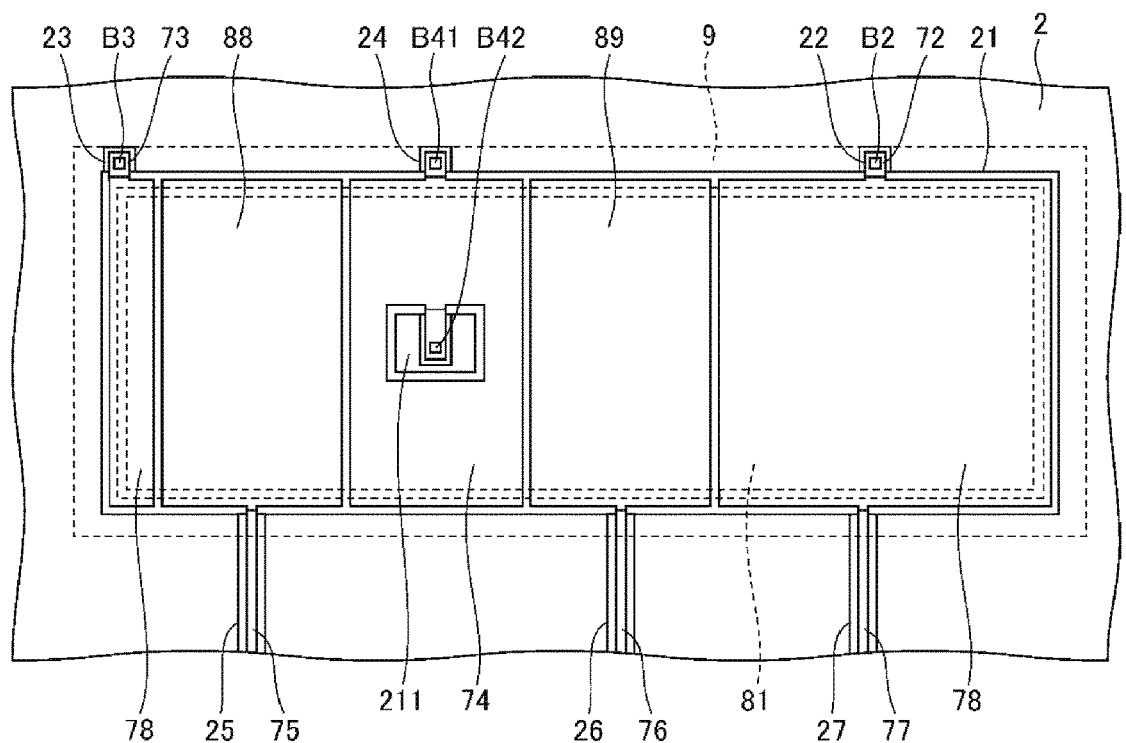
FIG. 14 is a plan view showing a substrate included in the physical quantity sensor shown in FIG. 12.

FIG. 12 is a plan view showing the physical quantity sensor according to the fifth embodiment of the invention. FIG. 13 is an C-C line sectional view in FIG. 12. FIG. 14 is a plan view showing a substrate included in the physical quantity sensor shown in FIG. 12.

The physical quantity sensor 1 according to this embodiment is the same as the physical quantity sensor 1 according to the first embodiment mainly except that the configurations of an element section 8 and the restricting section 9 are different.

Note that, in the following explanation, concerning the physical quantity sensor 1 according to the fifth embodiment, differences from the first embodiment explained above are mainly explained. Explanation of the similarities is omitted. In FIGS. 12 to 14, the same components as the components in the first embodiment explained above are denoted by the same reference numerals and signs.

The physical quantity sensor 1 shown in FIG. 12 is an acceleration sensor that can detect acceleration Az in the Z-axis direction. The element section 8 included in the physical quantity sensor 1 includes a movable electrode section 81, a beam section 82, and a fixed section 83.

The movable electrode section 81 is tabular and is formed in a longitudinal shape having the Y-axis direction as a longitudinal direction in the plan view from the Z-axis direction. The movable electrode section 81 is connected to the fixed section 83 via the beam section 82. The fixed section 83 includes a bonding section 831 to amount section 211. Note that the movable electrode section 81 includes an opening 819 on the inner side thereof. The beam section 82 and the fixed section 83 are disposed in the opening 819.

The movable electrode section 81 includes a first movable electrode section 811 located on one side (the Y-axis direction plus side) of a swing axis J formed by the beam section 82 in the plan view from the Z-axis direction and a second movable electrode section 812 located on the other side (the Y-axis direction minus side) of the swing axis J in the plan view from the Z-axis direction. The first movable electrode section 811 and the second movable electrode section 812 are designed such that rotation moments at the time when the acceleration Az is applied are different from each other. Therefore, when the acceleration Az is applied, the movable electrode section 81 swings in a seesaw manner around the swing axis J.

The element section 8 is formed by patterning a silicon substrate doped with an impurity such as phosphorus (P) or boron (B). The element section 8 is bonded to the substrate 2 by the anodic bonding. The element section 8 is electrically connected to the wire 74 in the mount section 211.

As shown in FIG. 13, a first fixed electrode section 88 opposed to the first movable electrode section 811 and a second fixed electrode section 89 opposed to the second movable electrode section 812 are provided on the bottom surface of the recessed section 21.

During operation of the physical quantity sensor 1, for example, the voltage V1 is applied to the movable electrode section 81 and the voltage V2 is applied to each of the first fixed electrode section 88 and the second fixed electrode section 89 (see FIG. 5). Therefore, capacitance is formed between the first movable electrode section 811 and the first fixed electrode section 88 and capacitance is formed between the second movable electrode section 812 and the second fixed electrode section 89.

When the acceleration Az is applied to the physical quantity sensor 1, the movable electrode section 81 swings in a seesaw manner around the swing axis J on the basis of the magnitude of the acceleration Az. A gap between the first movable electrode section 811 and the first fixed electrode section 88 and a gap between the second movable electrode section 812 and the second fixed electrode section 89 respectively change according to the seesaw swing. The capacitance between the first movable electrode section 811 and the first fixed electrode section 88 and the capacitance between the second movable electrode section 812 and the second fixed electrode section 89 respectively change according to the change of the gaps. Therefore, the acceleration Az can be detected on the basis of amounts of the changes in the capacitance, specifically, by performing a differential operation of a first detection signal obtained via the wire 75 and a second detection signal obtained via the wire 76.

As shown in FIG. 12, the restricting section 9 configured to restrict a movable range of the movable electrode section 81 is disposed around the movable electrode section 81. The restricting section 9 is formed in a frame shape. The first restricting section 91, the second restricting section 92, the third restricting section 93, and the fourth restricting section 94 are integrated. The first restricting section 91 is located on the Y-axis direction plus side of the movable electrode section 81. The second restricting section 92 is located on the Y-axis direction minus side of the movable electrode section 81. The third restricting section 93 is located on the X-axis direction plus side of the movable electrode section 81. The fourth restricting section 94 is located on the X-axis direction minus side of the movable electrode section 81. Note that the configuration of the restricting section 9 is the same as the configuration in the first embodiment explained above. Therefore, detailed explanation of the configuration is omitted.

With the restricting section 9, while allowing displacement (swing around the swing axis J) for detecting the acceleration Az of the movable electrode section 81, it is possible to prevent excessive displacement in directions other than the direction of the displacement. Therefore, damage to the element section 8 can be reduced. The physical quantity sensor 1 having excellent shock resistance is obtained.

As shown in FIG. 13, the dummy electrode 78 disposed to spread to substantially the entire region avoiding the first and second fixed electrode sections 88 and 89 is provided on the bottom surface of the recessed section 21. The dummy electrode 78 is electrically connected to the restricting section 9 via the wire 72 and the conductive bump B2. The restricting section 9 is electrically connected to the movable electrode section 81 via the conductive bump B41, the wire 74, and the conductive bump B42. Note that a function of the dummy electrode 78 is the same as the function explained in the first embodiment.

The first fixed electrode section 88 is electrically connected to the wire 75. The second fixed electrode section 89 is electrically connected to the wire 76. The wires 75 and 76 are respectively disposed to cross (extend across) the restricting section 9. By causing the wires 75 and 76 to cross the restricting section 9, as in the first embodiment, flexibility of drawing-around of the wires 75 and 76 is improved. In this embodiment, the parasitic capacitance Cm formed between the wire 75 and the restricting section 9 and the parasitic capacitance Cn formed between the wire 76 and the restricting section 9 are substantially equal. Therefore, by performing the differential operation of the first detection signal obtained via the wire 75 and the second detection signal obtained via the wire 76, the parasitic capacitance Cm and the parasitic capacitance Cn are cancelled. Therefore, the acceleration Az can be more accurately detected. Note that the Cm/Cn is not particularly limited. However, Cm/Cn is desirably 0.9 or more and 1.1 or less and more desirably 0.95 or more and 1.05 or less. Consequently, the effects explained above become more conspicuous.

The physical quantity sensor 1 according to this embodiment is explained above. As explained above, the physical quantity sensor 1 includes the substrate 2, the movable electrode section 81 (a movable section) including the first movable electrode section 811 (a first mass section) and the second movable electrode section 812 (a second mass section), the element section 8 (a swinging body) including the fixed section 83 supported by the substrate 2 disposed between the first movable electrode section 811 and the second movable electrode section 812 in the plan view and the beam section 82 (a coupling section) coupling the movable electrode section 81 and the fixed section 83, the first fixed electrode section 88 disposed on the substrate 2 to be opposed to the first movable electrode section 811, the second fixed electrode section 89 disposed on the substrate 2 to be opposed to the second movable electrode section 812, the restricting section 9 located along the outer edge of the element section 8 in the plan view and configured to restrict the movable range of the element section 8, the wire 75 (a first wire) provided on the substrate 2 and electrically connected to the first fixed electrode section 88, and the wire 76 (a second wire) provided on the substrate 2 and electrically connected to the second fixed electrode section 89. The wire 75 and the wire 76 respectively cross the restricting section 9 in the plan view.

With such a configuration, the movable electrode section 81 and the restricting section 9 come into contact, whereby excessive displacement of the movable electrode section 81 in the surface direction is prevented. Therefore, the physical quantity sensor 1 having excellent shock resistance is obtained. Flexibility of drawing-around of the wires 75 and 76 is improved. Therefore, compared with the configuration in which the wires 75 and 76 do not cross the restricting section 9, wiring length of the wires 75 and 76 can be reduced. Therefore, a region where the wires 75 and 76 are disposed can be reduced in size. Therefore, a region allocated to the element section 8 increases in size. As a result, it is possible to increase the element section 8 in size while keeping the size of the physical quantity sensor 1. Improvement of sensitivity of the physical quantity sensor 1 can be achieved. Further, for example, cost can be reduced and parasitic capacitance due to the wires 75 and 76 can be reduced.

The physical quantity sensor 1 in this embodiment is explained. Note that the physical quantity sensor 1 is not limited to this. For example, the restricting section 9 only has to be able to restrict at least one of the movable range in the X-axis direction and the movable range in the Y-axis direction of the movable electrode section 81. That is, if the restricting section 9 includes at least one of the first restricting section 91, the second restricting section 92, the third restricting section 93, and the fourth restricting section 94, the other restricting sections may be omitted.

Sixth Embodiment

A physical quantity sensor device according to a sixth embodiment of the invention is explained.

Figure 15:
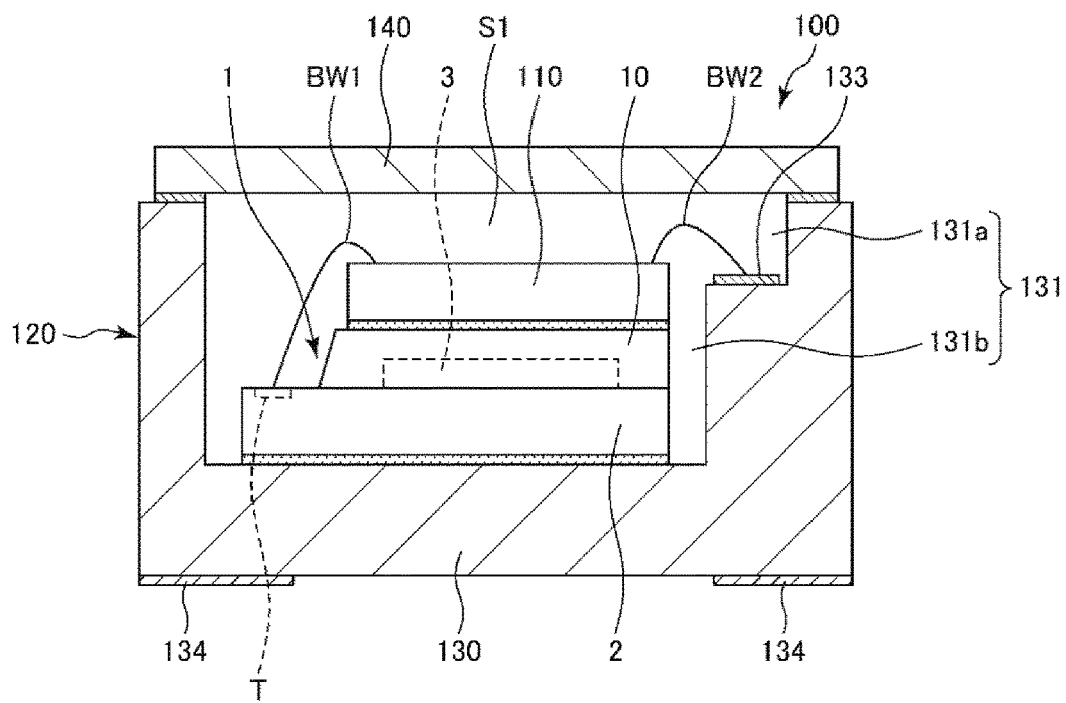
FIG. 15 is a sectional view showing a physical quantity sensor device according to a sixth embodiment of the invention.

FIG. 15 is a sectional view showing the physical quantity sensor device according to the sixth embodiment of the invention.

As shown in FIG. 15, a physical quantity sensor device 100 includes the physical quantity sensor 1, a circuit element 110, and a package 120 configured to house the physical quantity sensor 1 and the circuit element 110. The physical quantity sensor 1 is not particularly limited. For example, the physical quantity sensors 1 according to the embodiments explained above can be used. The physical quantity sensor device 100 can be suitably used as an inertia measurement unit (MIU).

The circuit element 110 (an IC) is bonded to the lid body 10 of the physical quantity sensor 1 via a bonding member. The circuit element 110 is electrically connected to the terminals T of the physical quantity sensor 1 via a bonding wire BW1 and electrically connected to the package 120 (an internal terminal 133 explained below) via a bonding wire BW2. The circuit element 110 includes, according to necessity, a driving circuit configured to drive the physical quantity sensor 1, a detection circuit configured to detect acceleration on the basis of an output signal from the physical quantity sensor 1, a correction circuit configured to correct the detected acceleration, and an output circuit configured to convert a signal output from the detection circuit into a predetermined signal and output the predetermined signal. Note that the circuit element 110 may be provided on the outer side of the package 120 or may be omitted.

The package 120 includes a base 130 and a lid body 140 bonded to the upper surface of the base 130 to form a housing space S1, in which the physical quantity sensor 1 and the circuit element 110 are housed, between the lid body 140 and the base 130.

The base 130 is formed in a cavity shape including a recessed section 131 opened on the upper surface of the base 130. The recessed section 131 includes a first recessed section 131a opened on the upper surface of the base 130 and a second recessed section 131b opened on the bottom surface of the first recessed section 131a.

On the other hand, the lid body 140 is tabular and is bonded to the upper surface of the base 130 to close the opening of the recessed section 131. In this way, the housing space S1 is formed by closing the opening of the recessed section 131 with the lid body 140. The physical quantity sensor 1 and the circuit element 110 are housed in the housing space S1.

The housing space S1 is hermetically sealed and has the same atmosphere as the atmosphere in the housing space S of the physical quantity sensor 1. Consequently, even if the airtightness of the housing space S is broken and the housing space S and the housing space S1 communicate, the atmosphere in the housing space S can be maintained. Therefore, a change in a physical quantity detection characteristic of the physical quantity sensor 1 due to a change in the atmosphere in the housing space S can be reduced. The physical quantity sensor device 100 that can perform stable driving is obtained. Note that the "same atmosphere" not only means that the atmospheres completely coincide but also means that the spaces have an inevitable error in manufacturing, for example, pressures in the spaces are slightly different. The atmosphere in the housing space S1 does not have to be the same as the atmosphere in the housing space S.

A constituent material of the base 130 is not particularly limited. Various ceramics, for example, oxide ceramics such as alumina, silica, titania, and zirconia and nitride ceramics such as silicon nitride, aluminum nitride, and titanium nitride can be used. In this case, the base 130 can be manufactured by sintering a stacked body of ceramic sheets (green sheets). By adopting such a configuration, the recessed section 131 can be easily manufactured.

A constituent material of the lid body 140 is not particularly limited. However, the constituent material is desirably a member having a coefficient of linear expansion approximate to a coefficient of linear expansion of the constituent material of the base 130. For example, when the constituent material of the base 130 is the ceramics described above, it is desirable to use an alloy such as Kovar as the constituent material of the lid body 140.

The base 130 includes a plurality of internal terminals 133 disposed on the bottom surface of the first recessed section 131a and a plurality of external terminals 134 disposed on the lower surface of the base 130. The internal terminals 133 are electrically connected to a predetermined external terminal 134 via a not-shown internal wire disposed in the base 130. The plurality of internal terminals 133 are respectively electrically connected to the circuit element 110 via the bonding wire BW2. Consequently, electric connection to the circuit element 110 can be performed from the outer side of the package 120. The physical quantity sensor device 100 is easily mounted.

The physical quantity sensor device 100 is explained above. The physical quantity sensor device 100 includes the physical quantity sensor 1 and the circuit element 110 as explained above. Therefore, the effects of the physical quantity sensor 1 explained above can be enjoyed. The physical quantity sensor device 100 having high reliability is obtained.

Note that the configuration of the physical quantity sensor device 100 is not particularly limited. For example, the disposition of the physical quantity sensor 1 and the circuit element 110 may be opposite to the displacement in this embodiment. That is, the circuit element 110 may be disposed on the bottom surface of the recessed section 131 and the physical quantity sensor 1 may be disposed on the upper surface of the circuit element 110. A configuration may be adopted in which the package 120 is eliminated and the circuit element 110 and the physical quantity sensor 1 are molded by a mold material.

Seventh Embodiment

An electronic device according to a seventh embodiment of the invention is explained.

Figure 16:
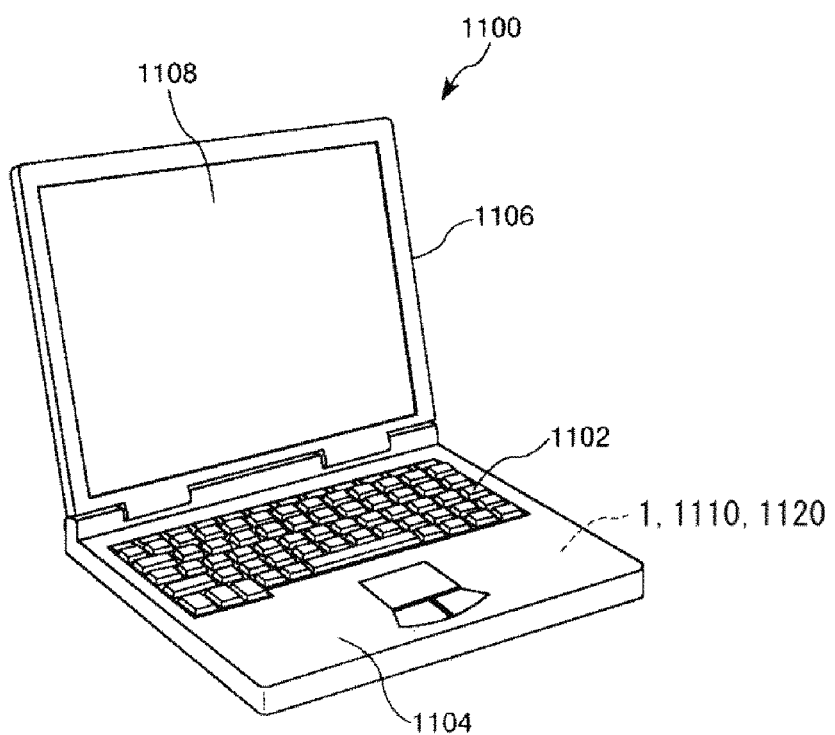
FIG. 16 is a perspective view showing an electronic device according to a seventh embodiment of the invention.

FIG. 16 is a perspective view showing the electronic device according to the seventh embodiment of the invention.

A personal computer 1100 of a mobile type (a notebook type) shown in FIG. 16 is an application of the electronic device according to this embodiment. In this figure, the personal computer 1100 is configured by a main body section 1104 including a keyboard 1102, and a display unit 1106 including a display section 1108. The display unit 1106 is turnably supported with respect to the main body section 1104 via a hinge structure section.

In the personal computer 1100, the physical quantity sensor 1, a control circuit 1110 configured to control driving of the physical quantity sensor 1, and a correction circuit 1120 configured to correct, on the basis of, for example, an environmental temperature, a physical quantity detected by the physical quantity sensor 1 are incorporated. Note that the physical quantity sensor 1 is not particularly limited. For example, all of the physical quantity sensors 1 according to the embodiments explained above can be used.

The personal computer 1100 (the electronic device) includes the physical quantity sensor 1, the control circuit 1110, and the correction circuit 1120. Therefore, the effects of the physical quantity sensor 1 explained above can be enjoyed. High reliability can be exerted.

Eighth Embodiment

An electronic device according to an eighth embodiment of the invention is explained.

Figure 17:
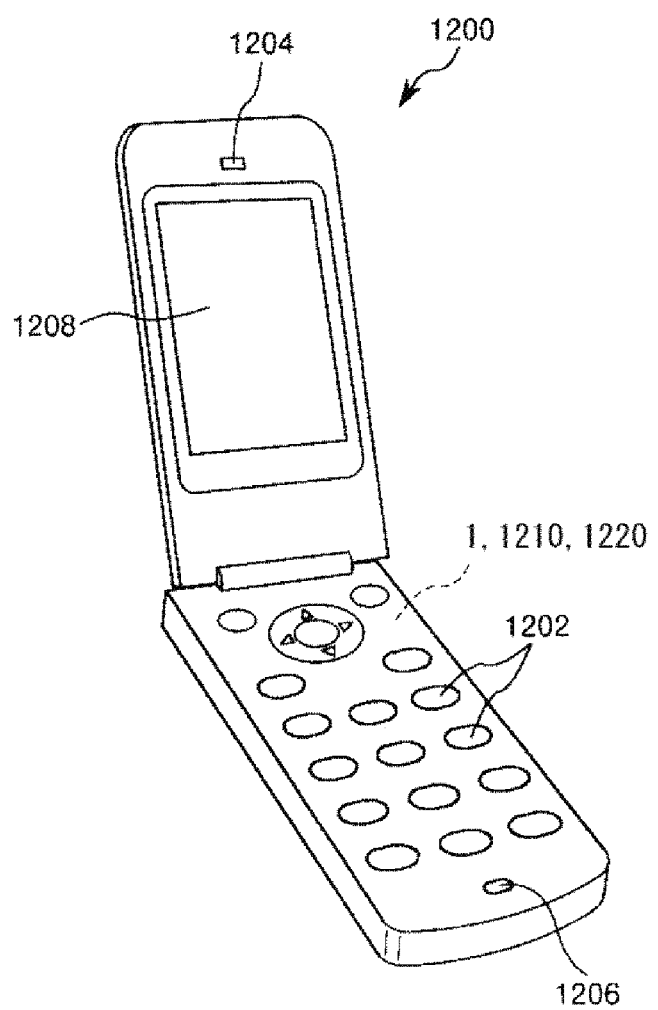
FIG. 17 is a perspective view showing an electronic device according to an eighth embodiment of the invention.

FIG. 17 is a perspective view showing the electronic device according to the eighth embodiment of the invention.

A cellular phone 1200 (including a PHS) shown in FIG. 17 is an application of the electronic device according to this embodiment. In this figure, the cellular phone 1200 includes an antenna (not shown in the figure), a plurality of operation buttons 1202, an ear piece 1204, and a mouth piece 1206. A display section 1208 is disposed between the operation buttons 1202 and the ear piece 1204.

In the cellular phone 1200, the physical quantity sensor 1, a control circuit 1210 configured to control driving of the physical quantity sensor 1, and a correction circuit 1220 configured to correct, on the basis of, for example, an environmental temperature, a physical quantity detected by the physical quantity sensor 1 are incorporated. Note that the physical quantity sensor 1 is not particularly limited. For example, all of the physical quantity sensors 1 according to the embodiments explained above can be used.

The cellular phone 1200 (the electronic device) includes the physical quantity sensor 1, the control circuit 1210, and the correction circuit 1220. Therefore, the effects of the physical quantity sensor 1 explained above can be enjoyed. High reliability can be exerted.

Ninth Embodiment

An electronic device according to a ninth embodiment of the invention is explained.

Figure 18:
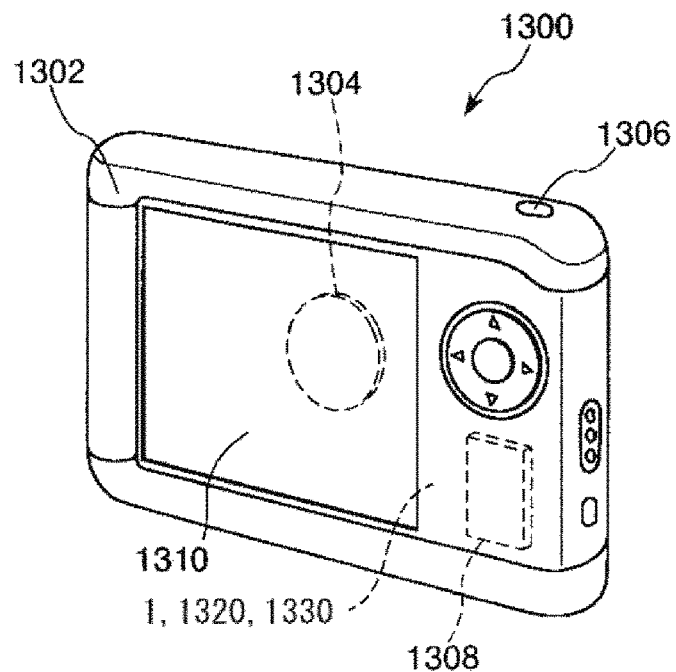
FIG. 18 is a perspective view showing an electronic device according to a ninth embodiment of the invention.

FIG. 18 is a perspective view showing the electronic device according to the ninth embodiment of the invention.

A digital still camera 1300 shown in FIG. 18 is an application of the electronic device according to this embodiment. In this figure, a display section 1310 is provided on the rear surface of a case 1302. The display section 1310 is configured to perform display on the basis of an imaging signal generated by a CCD. The display section 1310 functions as a finder that displays an object as an electronic image. A light receiving unit 1304 including an optical lens (an imaging optical system) and a CCD is provided on the front surface side (in the figure, the rear surface side) of the case 1302. When a photographer confirms an object image displayed on the display section 1310 and presses a shutter button 1306, an imaging signal of the CCD at that point in time is transferred to and stored in a memory 1308.

In the digital still camera 1300, the physical quantity sensor 1, a control circuit 1320 configured to control driving of the physical quantity sensor 1, and a correction circuit 1330 configured to correct, on the basis of, for example, an environment temperature, a physical quantity detected by the physical quantity sensor 1 are incorporated. Note that the physical quantity sensor 1 is not particularly limited. For example, all of the physical quantity sensors 1 according to the embodiments explained above can be used.

The digital still camera 1300 (the electronic device) includes the physical quantity sensor 1, the control circuit 1320, and the correction circuit 1330. Therefore, the effects of the physical quantity sensor 1 explained above can be enjoyed. High reliability can be exerted.

Note that the electronic device according to this embodiment can be applied to, besides the personal computer and the cellular phone in the embodiments explained above and the digital still camera in this embodiment, for example, a smartphone, a tablet terminal, a watch (including a smartwatch), an inkjet-type ejecting apparatus (e.g., an inkjet printer), a laptop personal computer, a television, a wearable terminal such as a HMD (head mounted display), a video camera, a video tape recorder, a car navigation device, a pager, an electronic notebook (including an electronic notebook with a communication function), an electronic dictionary, an electronic calculator, an electronic game machine, a word processor, a work station, a video phone, a television monitor for crime prevention, an electronic binocular, a POS terminal, medical devices (e.g., an electronic thermometer, a manometer, a blood sugar meter, an electrocardiographic device, an ultrasonic diagnosis device, and an electronic endoscope), a fish finder, various measuring devices, a device for a mobile terminal base station, meters (e.g., meters for a vehicle, an airplane, and a ship), a flight simulator, and a network server.

Tenth Embodiment

A portable electronic device according to a tenth embodiment of the invention is explained.

Figure 19:
FIG. 19 is a plan view showing a portable electronic device according to a tenth embodiment of the invention.
Figure 20:
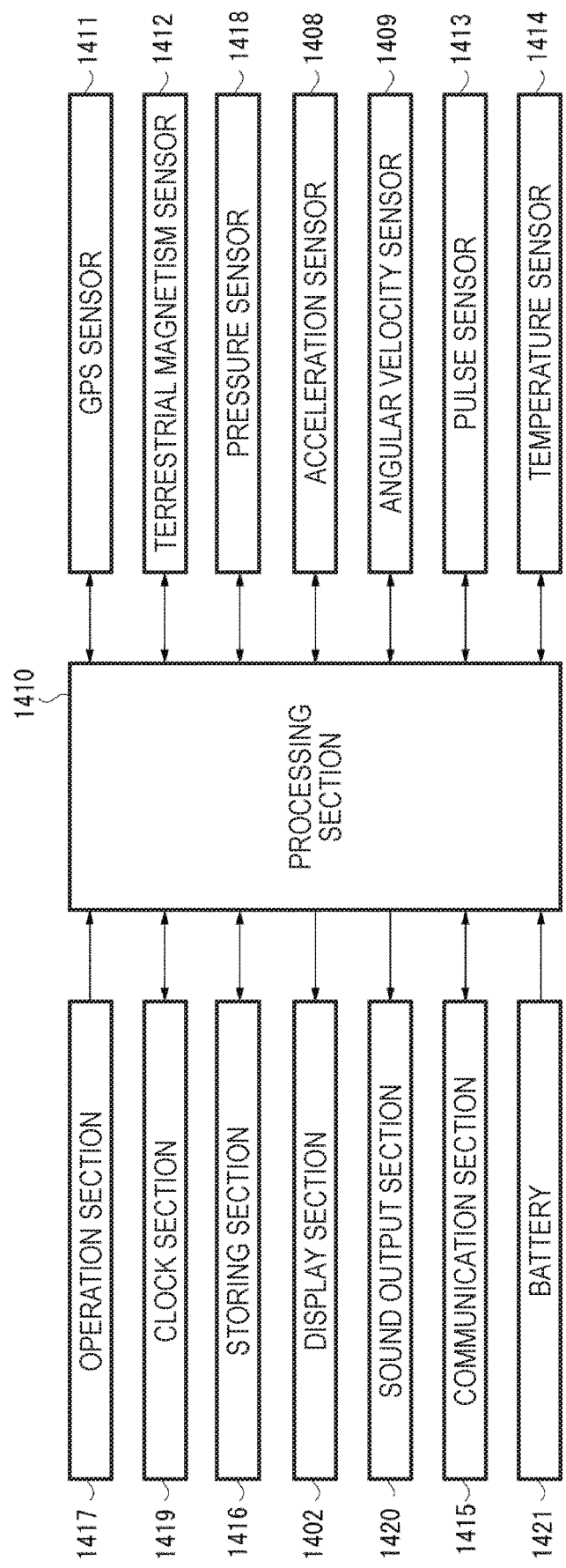
FIG. 20 is a functional block diagram showing a schematic configuration of the portable electronic device shown in FIG. 19.

FIG. 19 is a plan view showing the portable electronic device according to the tenth embodiment of the invention. FIG. 20 is a functional block diagram showing a schematic configuration of the portable electronic device shown in FIG. 19.

An activity meter 1400 (an active tracker) of a wristwatch type shown in FIG. 19 is a wrist device applied with the portable electronic device according to this embodiment. The activity meter 1400 is worn on a part (a subject) such as a wrist of a user by a band 1401. The activity meter 1400 includes a digital display section 1402 and is capable of performing wireless communication. The physical quantity sensor 1 according to any one of the embodiments explained above is incorporated in the activity meter 1400 as a sensor that measures acceleration or a sensor that measures angular velocity.

The activity meter 1400 includes a case 1403 in which the physical quantity sensor 1 is housed, a processing section 1410 housed in the case 1403 and configured to process output data from the physical quantity sensor 1, the display section 1402 housed in the case 1403, and a light-transmissive cover 1404 closing an opening section of the case 1403. A bezel 1405 is provided on the outer side of the light-transmissive cover 1404. A plurality of operation buttons 1406 and 1407 are provided on a side surface of the case 1403.

As shown in FIG. 20, an acceleration sensor 1408 functioning as the physical quantity sensor 1 detects respective accelerations in three-axis directions crossing (ideally, orthogonal to) one another and outputs signals (acceleration signals) corresponding to magnitudes and directions of the detected three-axis accelerations. An angular velocity sensor 1409 detects respective angular velocities in three-axis directions crossing (ideally, orthogonal to) one another and outputs signals (acceleration signals) corresponding to magnitudes and directions of the detected three-axis angular velocities.

On a liquid crystal display (LCD) configuring the display section 1402, for example, position information and a movement amount detected using a GPS sensor 1411 and a terrestrial magnetism sensor 1412, exercise information such as an exercise amount detected using the acceleration sensor 1408 and the angular velocity sensor 1409 included in the physical quantity sensor 1, biological information such as a pulse rate detected using a pulse sensor 1413 or the like, and time information such as present time are displayed according to various detection modes. Note that environmental temperature detected using a temperature sensor 1414 can also be displayed.

A communication section 1415 performs various kinds of control to establish communication between a user terminal and a not-shown information terminal. The communication section 1415 includes a transceiver adapted to a short range wireless communication standard such as Bluetooth (registered trademark) (including BTLE: Bluetooth Low Energy), Wi-Fi (registered trademark) (Wireless Fidelity), Zigbee (registered trademark), NFC (Near field communication), or ANT+(registered trademark) and a connector adapted to a communication bus standard such as USB (Universal Serial Bus).

The processing section 1410 (a processor) is configured by, for example, a MPU (Micro Processing Unit), a DSP (Digital Signal Processor), or an ASIC (Application Specific Integrated Circuit). The processing section 1410 executes various kinds of processing on the basis of computer programs stored in a storing section 1416 and signals input from an operation section 1417 (e.g., the operation buttons 1406 and 1407). The processing by the processing section 1410 includes data processing for output signals of the GPS sensor 1411, the terrestrial magnetism sensor 1412, a pressure sensor 1418, the acceleration sensor 1408, the angular velocity sensor 1409, the pulse sensor 1413, the temperature sensor 1414, and a clocking section 1419, display processing for causing the display section 1402 to display an image, sound output processing for causing a sound output section 1420 to output sound, communication processing for performing communication with an information terminal via the communication section 1415, and power control processing for supplying electric power from a battery 1421 to the sections.

The activity meter 1400 can have at least the following functions.

1. Distance: measuring a total distance from a measurement start with a high-precision GPS function.
2. Pace: displaying a present running pace from pace distance measurement.
3. Average speed: calculating and displaying average speed from an average speed running start to the present.
4. Altitude: measuring and displaying an altitude with a GPS function.
5. Stride: measuring and displaying a step even in a tunnel or the like where a GPS radio wave does not reach.
6. Pitch: measuring and displaying the number of steps per minute.
7. Heart rate: measuring and displaying a heart rate with a pulse sensor.
8. Gradient: measuring and displaying a gradient of the ground in training or trail run in a mountainous area.
9. Auto lap: automatically performing lap measurement when a user runs a fixed distance or a fixed time set beforehand.
10. Exercise consumed calorie: displaying a consumed calorie.
11. Number of steps: displaying a total of the number of steps from an exercise start.

The activity meter 1400 (the portable electronic device) includes the physical quantity sensor 1, the case 1403 in which the physical quantity sensor 1 is housed, the processing section 1410 housed in the case 1403 and configured to process output data from the physical quantity sensor 1, the display section 1402 housed in the case 1403, and the light-transmissive cover 1404 closing the opening section of the case 1403. Therefore, the effects of the physical quantity sensor 1 explained above can be enjoyed. High reliability can be exerted.

Note that the activity meter 1400 can be widely applied to a running watch, a runner's watch, a runner's watch adaptable to multi-sports such as duathlon and triathlon, an outdoor watch, a GPS watch mounted with a satellite positioning system, for example, a GPS, and the like.

In the above explanation, the GPS (Global Positioning System) is used as the satellite positioning system. However, other Global Navigation Satellite Systems (GNSSs) may be used. For example, one or two or more of satellite positioning systems such as an EGNOS (European Geostationary-Satellite Navigation Overlay Service), a QZSS (Quasi Zenith Satellite System), a GLONASS (GLObal NAvigation Satellite System), a GALILEO, and a BeiDou (BeiDou Navigation Satellite System) may be used. A Satellite-based Augmentation System (SBAS) such as a WAAS (Wide Area Augmentation System) or an EGNOS (European Geostationary-Satellite Navigation Overlap Service) may be used as at least one of the satellite positioning systems.

Eleventh Embodiment

A mobile body according to an eleventh embodiment of the invention is explained.

Figure 21:
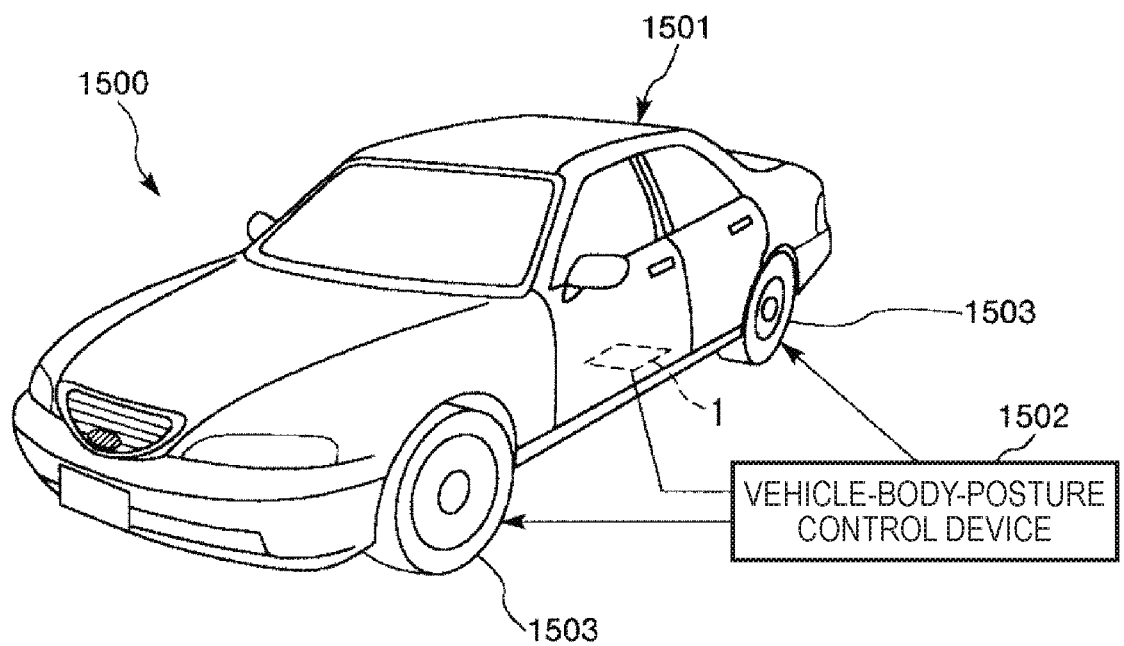
FIG. 21 is a perspective view showing a mobile body according to an eleventh embodiment of the invention.

FIG. 21 is a perspective view showing the mobile body according to the eleventh embodiment of the invention.

An automobile 1500 shown in FIG. 21 is an automobile applied with the mobile body according to this embodiment. In this figure, the physical quantity sensor 1 functioning as at least one of an acceleration sensor and an angular velocity sensor (preferably, a composite sensor that can detect both of acceleration and angular velocity) is incorporated in the automobile 1500. A posture of a vehicle body 1501 can be detected by the physical quantity sensor 1. A detection signal of the physical quantity sensor 1 is supplied to a vehicle-body-posture control device 1502 (a posture control section). The vehicle-body-posture control device 1502 can detect the posture of the vehicle body 1501 on the basis of the signal, control hardness and softness of a suspension according to a result of the detection, and control brakes of respective wheels 1503. As the physical quantity sensor 1, for example, the same physical quantity sensor 1 as the physical quantity sensors 1 according to the embodiments can be used.

The automobile 1500 (the mobile body) includes the physical quantity sensor 1 and the vehicle-body-posture control device 1502 (the posture control section). Therefore, the effects of the physical quantity sensor 1 can be enjoyed. High reliability can be exerted.

Note that, besides, the physical quantity sensor 1 can be widely applied to electronic control units (ECUs) of a car navigation system, a car air conditioner, an antilock brake system (ABS), an air bag, a tire pressure monitoring system (TPMS), an engine control, a battery monitor of a hybrid automobile and an electric automobile, and the like.

The mobile body is not limited to the automobile 1500. The mobile body can also be applied to, for example, an airplane, a rocket, an artificial satellite, a ship, an AGV (Automatic Guided Vehicle), a bipedal walking robot, and an unmanned aircraft such as a drone.

The embodiments of the invention including the physical quantity sensor, the physical quantity sensor device, the portable electronic device, the electronic device and the mobile body are explained above with reference to the drawings. However, the invention is not limited to the embodiments. The components of the sections can be replaced with any components having the same functions. Any other components may be added to the invention. The embodiments may be combined as appropriate.

In the embodiments, the physical quantity sensor that detects acceleration is explained. However, the physical quantity sensor is not limited to this. For example, the physical quantity sensor may detect angular velocity. The physical quantity sensor may detect both of the acceleration and angular velocity.

In the embodiments, the X axis, the Y axis, and the Z axis are orthogonal to one another. However, the X axis, the Y axis, and the Z axis are not limited to this if the X axis, the Y axis, and the Z axis are cross one another. For example, the X axis may slightly tilt with respect to the normal direction of the YZ plane. The Y axis may slightly tilt with respect to the normal direction of the XZ plane. The Z axis may slightly tilt with respect to the normal direction of the XY plane. Note that "slightly" means a range in which the physical quantity sensor 1 can exert the effects of the physical quantity sensor 1. A specific tilt angle (a numerical value) is different depending on a configuration and the like.

The entire disclosure of Japanese Patent Application No. 2017-167621, filed Aug. 31, 2017 is expressly incorporated by reference herein.

What is claimed is:

1. A physical quantity sensor comprising:
   a substrate that is plate-shaped on a plane extending along an X-axis direction and a Y-axis direction, the substrate having a thickness along a Z-axis direction, wherein the X-axis direction, the Y-axis direction, and the Z-axis direction are orthogonal to each other;
   a movable member extending in the X-axis direction and the Y-axis direction, the movable member having a first side surface, a second side surface, a third side surface, and a fourth side surface, the first and second side surfaces being outwardly opposite to each other along the X-axis direction and extending along the Y-axis direction, the third and fourth side surfaces being outwardly opposite to each other along the Y-axis direction and extending along the X-axis direction, the movable member being movable in the X-axis direction, the movable member being configured with:
      a first movable electrode extending in the Y-axis direction; and
      a second movable electrode extending in the Y-axis direction;
   a first fixed electrode fixed to the substrate, the first fixed electrode extending in the Y-axis direction, the first fixed electrode facing the first movable electrode in the X-axis direction;
   a second fixed electrode fixed to the substrate, the second fixed electrode extending in the Y-axis direction, the second fixed electrode facing the second movable electrode in the X-axis direction;
   a single restricting member facing only the first side surface of the movable member along the X-axis direction and extending along the Y-axis direction, the single restricting member being configured to restrict a movable range of the movable member when the movable member moves in the X-axis direction;
   a first wire provided on the substrate and electrically connected to the first fixed electrode; and
   a second wire provided on the substrate and electrically connected to the second fixed electrode,
   wherein the first wire and the second wire respectively cross the single restricting member when viewed in the Z-axis direction.

2. The physical quantity sensor according to claim 1, wherein the movable member and the single restricting member are electrically connected.

3. A portable electronic device comprising:
   the physical quantity sensor according to claim 2;
   a case in which the physical quantity sensor is housed;
   a processing section housed in the case and configured to process output data from the physical quantity sensor;
   a display section housed in the case; and
   a light-transmissive cover closing an opening section of the case.

4. An electronic device comprising:
   the physical quantity sensor according to claim 2;
   a control circuit configured to control the physical quantity sensor; and
   a correction circuit configured to correct a value detected by the physical quantity sensor.

5. A mobile body comprising:
   the physical quantity sensor according to claim 2; and
   a posture control section configured to detect a posture of the mobile body based on a detection signal of the physical quantity sensor.

6. The physical quantity sensor according to claim 1, further comprising a connection electrode disposed on the substrate to overlap the movable member in the Z-axis direction and electrically connected to the movable member.

7. A portable electronic device comprising:
   the physical quantity sensor according to claim 1;
   a case in which the physical quantity sensor is housed;
   a processing section housed in the case and configured to process output data from the physical quantity sensor;
   a display section housed in the case; and
   a light-transmissive cover closing an opening section of the case.

8. An electronic device comprising:
   the physical quantity sensor according to claim 1;
   a control circuit configured to control the physical quantity sensor; and
   a correction circuit configured to correct a value detected by the physical quantity sensor.

9. A mobile body comprising:
   the physical quantity sensor according to claim 1; and
   a posture control section configured to detect a posture of the mobile body based on a detection signal of the physical quantity sensor.

10. A physical quantity sensor comprising:
    a substrate that is plate-shaped on a plane extending along an X-axis direction and a Y-axis direction, the substrate having a thickness along a Z-axis direction, wherein the X-axis, the Y-axis, and the Z-axis are orthogonal to each other;
    a swinging body extending in the X-axis direction and the Y-axis direction, the swinging body including a movable section, a fixed section, and a coupling section, the movable section including a first mass section and a second mass section, the fixed section being supported by the substrate, the coupling section coupling the movable section and the fixed section, the swinging body having a first side surface, a second side surface, a third side surface, and a fourth side surface, the first and second side surfaces being outwardly opposite to each other along the X-axis direction and extending along the Y-axis direction, the third and fourth side surfaces being outwardly opposite to each other along the Y-axis direction and extending along the X-axis direction;
    a first fixed electrode disposed on the substrate, the first fixed electrode extending in the X-axis direction and the Y-axis direction, the first fixed electrode facing the first mass section;
    a second fixed electrode disposed on the substrate, the second fixed electrode extending in the X-axis direction and the Y-axis direction, the second fixed electrode facing the second mass section;
    a restricting section having first, second, third, and fourth restricting sections that face the first, second, third, and fourth side surfaces of the swinging body, respectively, the restricting section being configured to restrict a movable range of the swinging body when the swinging body moves in the X-axis direction and the Y-axis direction;

a first wire provided on the substrate and electrically connected to the first fixed electrode; and a second wire provided on the substrate and electrically connected to the second fixed electrode, wherein the first wire and the second wire respectively cross the first restricting section when viewed in the Z-axis direction, and the first restricting section, the second restricting section, the third restricting section, and the fourth restricting section are integrated.

11. A physical quantity sensor device comprising:

a physical quantity sensor, the physical quantity sensor being configured with:

a substrate that is plate-shaped on a plane extending along an X-axis direction and a Y-axis direction, the substrate having a thickness along a Z-axis direction, wherein the X-axis direction, the Y-axis direction, and the Z-axis direction are orthogonal to each other;

a movable member extending in the X-axis direction and the Y-axis direction, the movable member having a first side surface, a second side surface, a third side surface, and a fourth side surface, the first and second side surfaces being outwardly opposite to each other along the X-axis direction and extending along the Y-axis direction, the third and fourth side surfaces being outwardly opposite to each other along the Y-axis direction and extending along the X-axis direction, the movable member being movable in the X-axis direction, the movable member being configured with:

a first movable electrode extending in the Y-axis direction; and a second movable electrode extending in the Y-axis direction;

a first fixed electrode fixed to the substrate, the first fixed electrode extending in the Y-axis direction, the first fixed electrode facing the first movable electrode in the X-axis direction;

a second fixed electrode fixed to the substrate, the second fixed electrode extending in the Y-axis direction, the second fixed electrode facing the second movable electrode in the X-axis direction;

a single restricting member facing only the first side surface of the movable member and extending along the Y-axis direction, the single restricting member being configured to restrict a movable range of the movable member when the movable member moves in the X-axis direction;

a first wire provided on the substrate and electrically connected to the first fixed electrode; and a second wire provided on the substrate and electrically connected to the second fixed electrode; and a circuit element configured to drive the physical quantity sensor and to receive an output signal from the physical quantity sensor, wherein the first wire and the second wire respectively cross the single restricting member when viewed in the Z-axis direction.

12. The physical quantity sensor device according to claim 11, wherein the movable member and the single restricting member are electrically connected.

* * * * *